United States Patent [19]
Shimizume

[11] Patent Number: 5,349,349
[45] Date of Patent: Sep. 20, 1994

[54] MODULATOR CIRCUIT FOR A RECORDING FOR A DIGITAL RECORDING MEDIUM

[75] Inventor: Kazutoshi Shimizume, Kanagawa, Japan

[73] Assignee: Sony Corporation, Japan

[21] Appl. No.: 946,963

[22] Filed: Sep. 17, 1992

[30] Foreign Application Priority Data

Sep. 30, 1991 [JP] Japan .................................. 3-250654
Sep. 30, 1991 [JP] Japan .................................. 3-250698
Sep. 30, 1991 [JP] Japan .................................. 3-250708

[51] Int. Cl.$^5$ ............................................. H03M 7/00
[52] U.S. Cl. ...................................... 341/58; 341/69; 360/40
[58] Field of Search ................... 341/58, 59, 95, 68, 341/69; 375/19; 360/40, 41

[56] References Cited

U.S. PATENT DOCUMENTS

| | | | |
|---|---|---|---|
| 4,517,552 | 5/1985 | Shirota et al. | 340/347 DD |
| 4,731,678 | 3/1988 | Takeuchi | 360/40 |
| 5,077,721 | 12/1991 | Sako et al. | 360/40 X |
| 5,206,646 | 4/1993 | Sako et al. | 341/95 |

Primary Examiner—Howard L. Williams
Attorney, Agent, or Firm—Limbach & Limbach

[57] ABSTRACT

A modulator circuit is constructed such that an input signal is code converted, after an error code correction code is added thereto, into a channel bit pattern suitable for characteristics of a recording and reproducing system for recording and reproduction of digital data. Margin bits are inserted between adjacent channel bit patterns in order to limit the lengths of the channel bit patterns. One or ones of a plurality of predetermined margin bit patterns which are to be inhibited from being inserted between particular two channel bit patterns are determined in accordance with a predetermined algorithm referring to the second last, the last and the present channel bit patterns and the last margin bit pattern. The output of an integrating circuit for measuring a digital sum variation of a channel bit pattern signal and a channel bit pattern is provided with a saturation characteristic so that the output may not diverge. A margin bit generating circuit receives a signal regarding one or ones of the margin bit patterns which are to be inhibited from use, a controlling signal regarding a channel bit pattern placed prior to the margin bit pattern and a cumulative digital sum variation and another controlling signal regarding another cumulative digital sum variation of another channel bit pattern placed subsequent to the margin bit pattern, and the scale of the modulator circuit is reduced with the margin bit generating circuit.

4 Claims, 21 Drawing Sheets

FIG. 1A
PRIOR ART
SIGNAL FORMAT OF CD SYSTEM
| | |
|---|---|
| SAMPLING FREQUENCY | 44.1 kHz |
| QUANTIZATION NUMBER | 16 BITS (LINEAR) |
| MODULATING SYSTEM | EFM |
| CHANNEL BIT RATE | 4.3218 Mb/S |
| ERROR CORRECTION SYSTEM | CIRC |
| DATA TRANSFER RATE | 2.034 Mb/S |
FIG. 1B
PRIOR ART
FRAME CONSTRUCTION
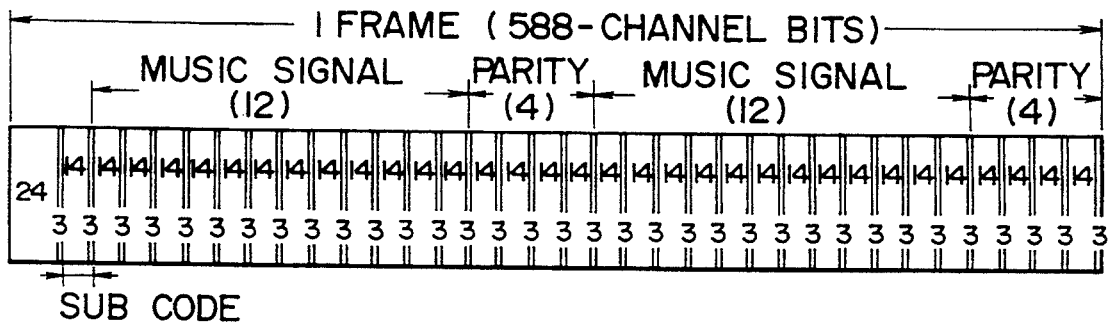
FIG. 1C
PRIOR ART
SUB CODING FRAME CONSTRUCTION
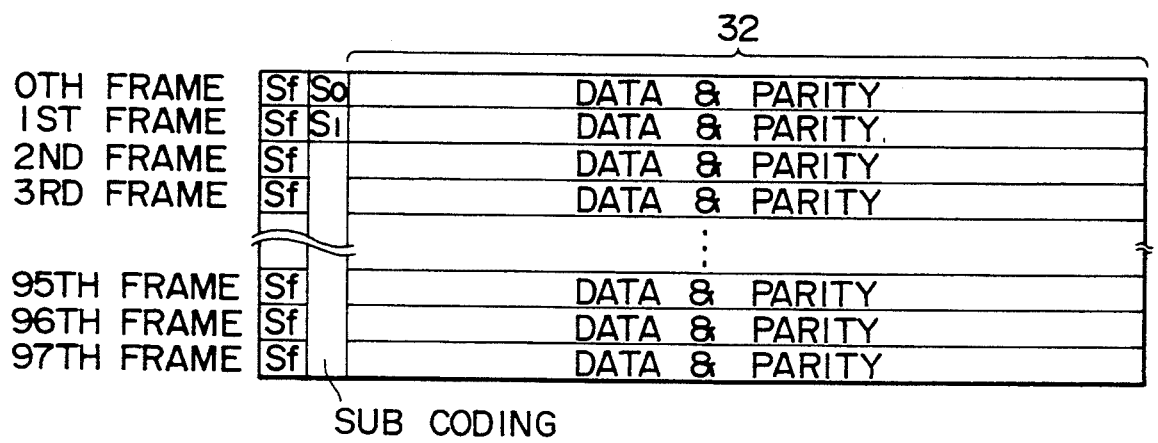

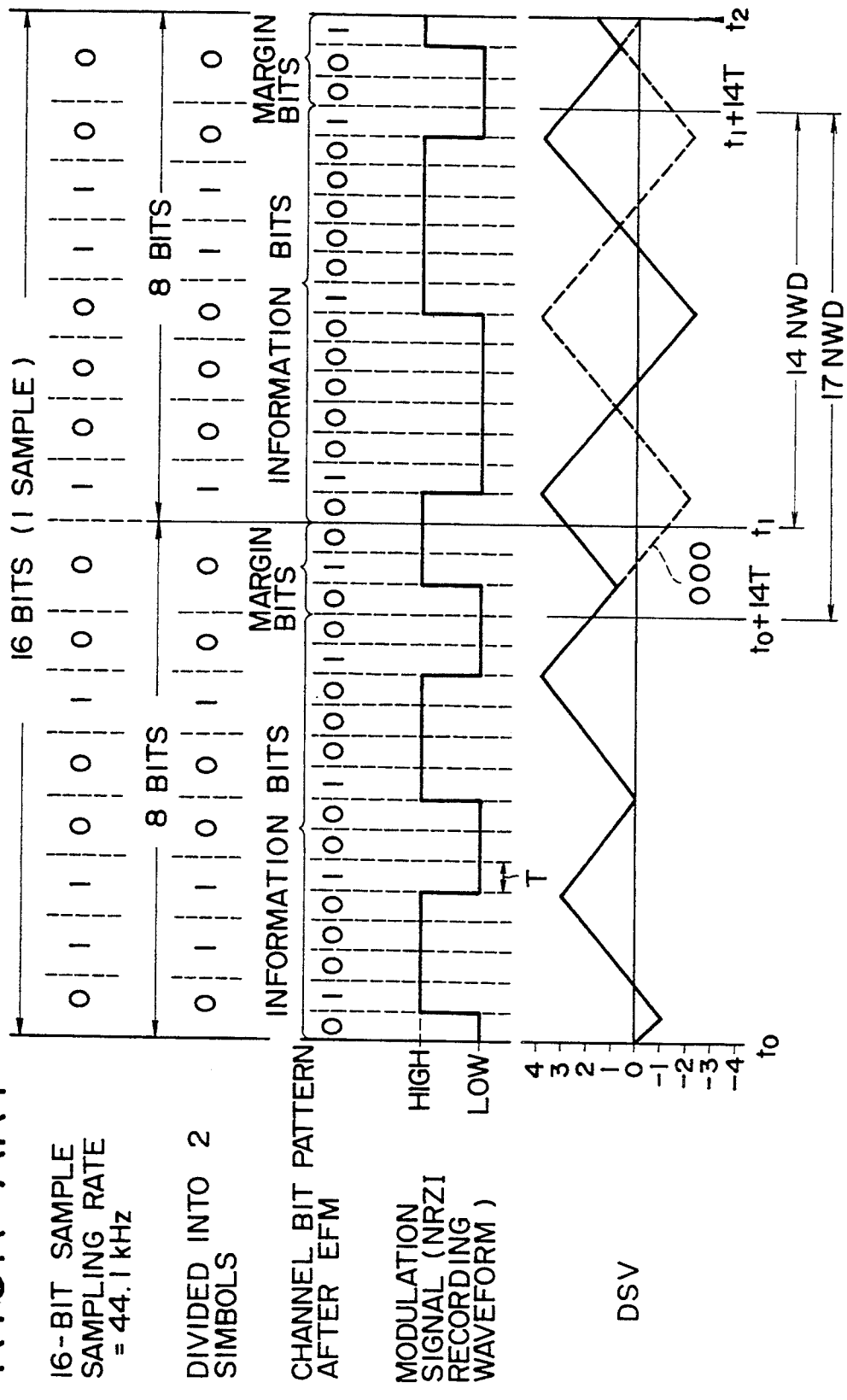

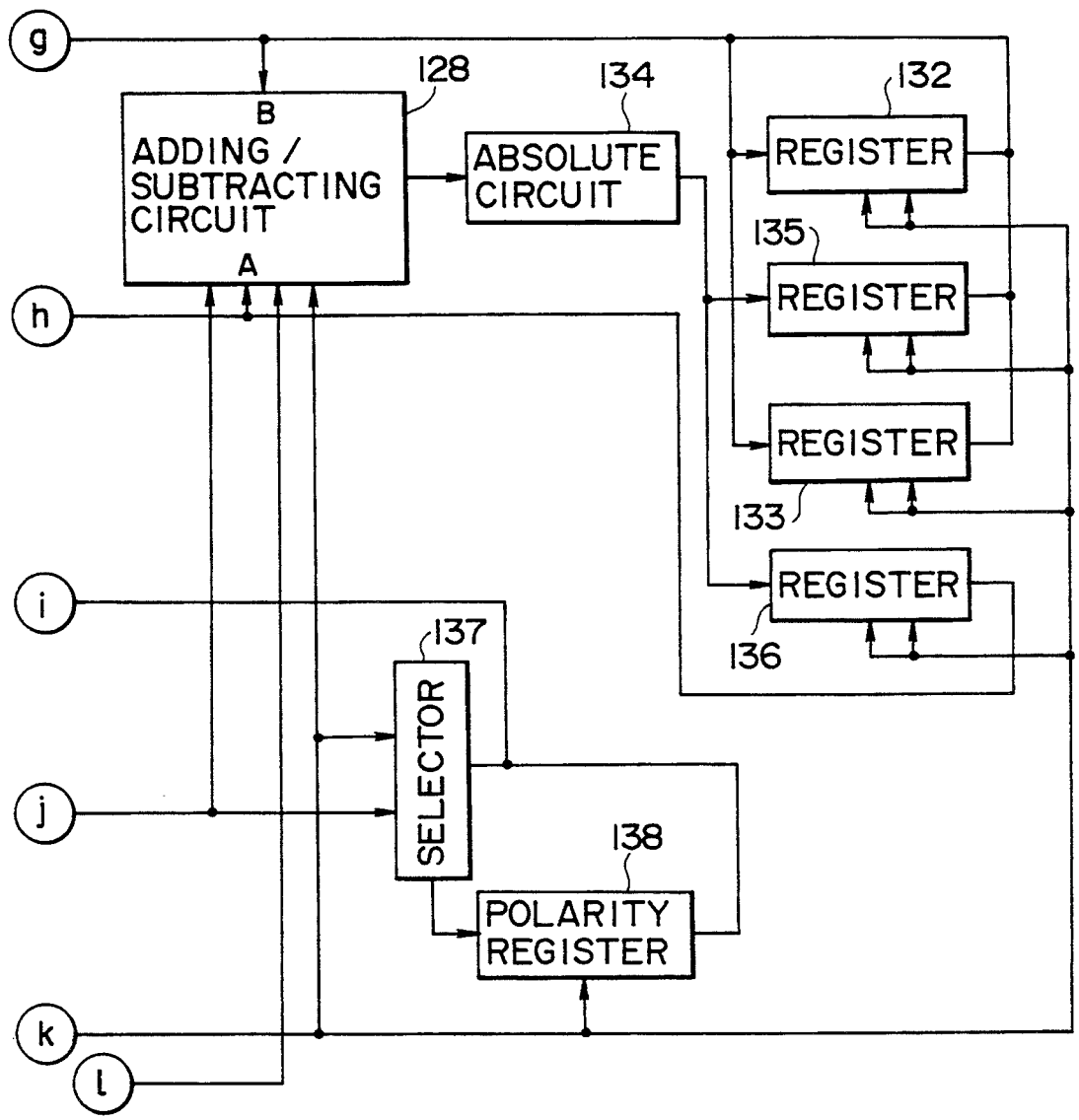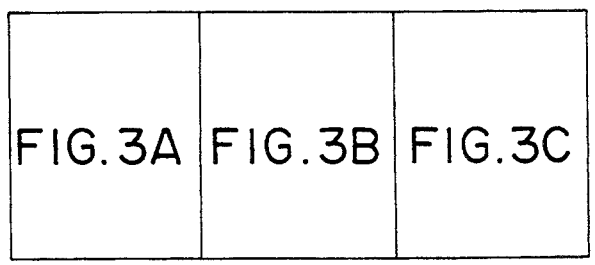

FALSE FRAME SYNCHRONIZATION
ADDING CIRCUIT 13

FRAME SYNCHRONIZATION
TIMING SIGNAL

FIG. 6A  JUDGMENT IN CONFORMITY TO EFM 3T TO 11T RULE

FIG. 6B

JUDGMENT IN CONFORMITY TO EXCEPTIONAL INHIBITION RULE

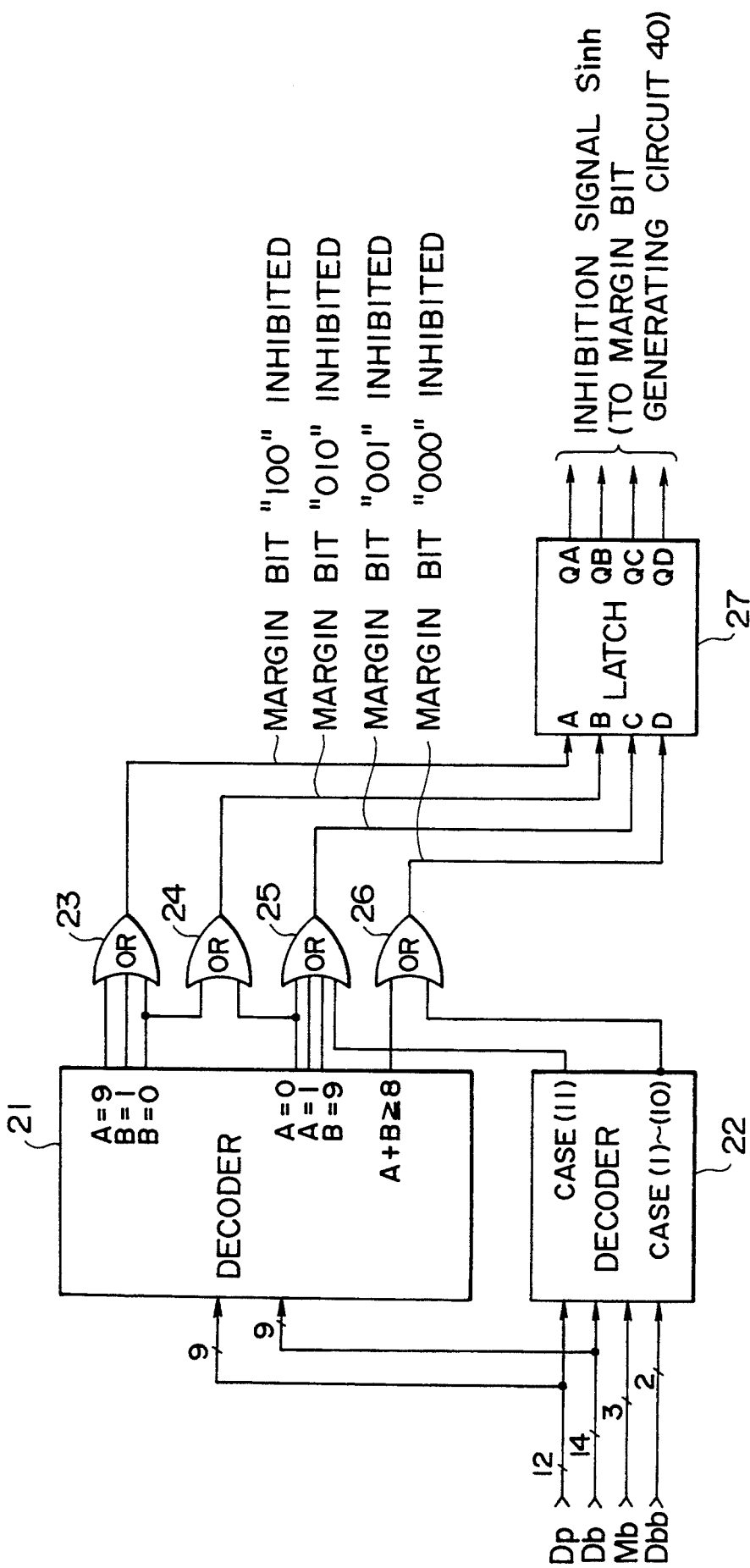

DSV INTEGRATING CIRCUIT 60 OF THE PRESENT INVENTION

EXPLANATORY VIEW OF INTEGRATING CIRCUIT 62

FIG. 10 MARGIN BIT GENERATING CIRCUIT 40 OF THE PRESENT INVENTION

NOMOGRAPH WHEN CWLL = "0"

NOMOGRAPH WHEN CWLL = "1"

FIG. 14A

TRUTH TABLE FOR DECODER 41

| INPUT | | OUTPUT |
|---|---|---|
| CWLL | CONTROLLING SIGNAL FROM DSV INTEGRATING CIRCUIT 60 | |
| 0 | 1 0 0 (INCREASING INSTRUCTION) | 1 0 0 |
| 0 | 0 1 0 (BALANCING INSTRUCTION) | 0 1 0 |
| 0 | 0 0 1 (DECREASING INSTRUCTION) | 0 0 1 |
| 1 | 1 0 0 (INCREASING INSTRUCTION) | 0 0 1 |
| 1 | 0 1 0 (BALANCING INSTRUCTION) | 0 1 0 |
| 1 | 0 0 1 (DECREASING INSTRUCTION) | 1 0 0 |

FIG. 14B

TRUTH TABLE FOR DECODER 42

| INPUT (14NWD) | OUTPUT | |
|---|---|---|
| ⋮<br>0 0 1 0 0<br>0 0 0 1 1 | 1 0 0 0 | $14NWD \geq 3$ |
| 0 0 0 1 0 | 0 1 0 0 | $14NWD = 2$ |
| 0 0 0 0 1 | 0 0 1 0 | $14NWD = 1$ |
| 0 0 0 0 0 | 0 0 0 1 | $14NWD = 0$ |
| 1 1 1 1 1<br>1 1 1 1 0<br>⋮ | 0 0 0 0 | $14NWD \leq -1$ |

FIG. 15A
TRUTH TABLE FOR PLA 43

| CWLL | 14NWD | | | | | INHIBITION SIGNAL | | | CONTROLLING SIGNAL | | | MARGIN BIT OUTPUT | PRIORITY ORDER | REMARKS |
|---|---|---|---|---|---|---|---|---|---|---|---|---|---|---|
| | ≤-1 | 0 | 1 | 2 | +3≤ | 001 | 010 | 100 | 000 | + | 0 | - | | | |
| 0 | X | 0 | 0 | 0 | 1 | X | X | X | 0 | X | X | 0 | 000 | 1 | WHEN 14NWD=3 OR MORE AND CONTROLLING SIGNAL IS "INCREASE" OR "BALANCE" |
|   | DITTO | | | | | X | X | 0 | 1 |   |   |   | 100 | 2 | |
|   |   | | | | | X | 0 | 1 | 1 | DITTO | | | 010 | 3 | |
|   |   | | | | | 0 | 1 | 1 | 1 |   |   |   | 001 | 4 | |
|   | DITTO | | | | | X | 0 | X | X | X | X | 1 | 010 | 1 | WHEN 14NWD=3 OR MORE AND CONTROLLING SIGNAL IS "INCREASE" OR "BALANCE" |
|   |   | | | | | 0 | 1 | X | X |   |   |   | 001 | 2 | |
|   |   | | | | | 1 | 1 | 0 | X | DITTO | | | 100 | 3 | |
|   |   | | | | | 1 | 1 | 1 | 0 |   |   |   | 000 | 4 | |
|   | X | 0 | 0 | 1 | 0 | X | X | 0 | X | X | X | 0 | 100 | 1 | WHEN 14NWD=2 AND CONTROLLING SIGNAL IS "INCREASE" OR "BALANCE" |
|   |   | | | | | X | X | 1 | 0 |   |   |   | 000 | 2 | |
|   |   | | | | | X | 0 | 1 | 1 | DITTO | | | 010 | 2 | |
|   |   | | | | | 0 | 1 | 1 | 1 |   |   |   | 001 | 3 | |
|   | DITTO | | | | | X | X | X | 0 | X | X | 1 | 000 | 1 | WHEN 14NWD=2 AND CONTROLLING SIGNAL IS "DECREASE" |
|   |   | | | | | X | 0 | X | 1 |   |   |   | 010 | 1 | |
|   |   | | | | | 0 | 1 | X | 1 | DITTO | | | 001 | 2 | |
|   |   | | | | | 1 | 1 | 0 | 1 |   |   |   | 100 | 3 | |
|   | X | 0 | 1 | 0 | 0 | X | X | 0 | X | 1 | X | X | 100 | 1 | WHEN 14NWD=1 AND CONTROLLING SIGNAL IS "INCREASE" |
|   |   | | | | | X | 0 | 1 | X |   |   |   | 010 | 2 | |
|   |   | | | | | 0 | 1 | 1 | X | DITTO | | | 001 | 3 | |
|   |   | | | | | 1 | 1 | 1 | 0 |   |   |   | 000 | 3 | |
|   | DITTO | | | | | X | 0 | X | X | X | 1 | X | 010 | 1 | WHEN 14NWD=1 AND CONTROLLING SIGNAL IS "INCREASE" |
|   |   | | | | | 0 | 1 | X | X |   |   |   | 001 | 2 | |
|   |   | | | | | 1 | 1 | 0 | X | DITTO | | | 100 | 2 | |
|   |   | | | | | 1 | 1 | 1 | 0 |   |   |   | 000 | 2 | |
|   | DITTO | | | | | X | X | X | 0 | X | X | 1 | 000 | 1 | WHEN 14NWD=1 AND CONTROLLING SIGNAL IS "DECREASE" |
|   |   | | | | | 0 | X | X | 1 |   |   |   | 001 | 1 | |
|   |   | | | | | 1 | 0 | X | 1 | DITTO | | | 010 | 2 | |
|   |   | | | | | 1 | 1 | 0 | 1 |   |   |   | 100 | 3 | |

FIG. 15B

TRUTH TABLE FOR PLA 43

| CWLL | 14NWD | | | | | INHIBITION SIGNAL | | | | CONTROL-LING SIGNAL | | | MARGIN BIT OUTPUT | PRIORITY ORDER | REMARKS |
|---|---|---|---|---|---|---|---|---|---|---|---|---|---|---|---|
| | ≤-1 | 0 | 1 | 2 | +3≤ | 001 | 010 | 100 | 000 | + | 0 | - | | | |
| 0 | X | 1 | 0 | 0 | 0 | X | X | 0 | X | 1 | X | X | 100 | 1 | WHEN 14NWD= 0 AND CONTROLLING SIGNAL IS "INCREASE" |
| | | | | | | X | 0 | 1 | X | | | | 010 | 2 | |
| | | | | | | 0 | 1 | 1 | X | DITTO | | | 001 | 3 | |
| | | | | | | 1 | 1 | 1 | 0 | | | | 000 | 4 | |
| | | | | | | X | 0 | X | X | X | 1 | X | 010 | 1 | WHEN 14NWD= 0 AND CONTROLLING SIGNAL IS "BALANCE" |
| | | | | | | 0 | 1 | X | X | | | | 001 | 1 | |
| | DITTO | | | | | 1 | 1 | 0 | X | DITTO | | | 100 | 2 | |
| | | | | | | 1 | 1 | 1 | 0 | | | | 000 | 2 | |
| | | | | | | X | X | X | 0 | X | X | 1 | 000 | 1 | WHEN 14NWD= 0 AND CONTROLLING SIGNAL IS "DECREASE" |
| | | | | | | 0 | X | X | 1 | | | | 001 | 2 | |
| | | | | | | 1 | 0 | X | 1 | DITTO | | | 010 | 3 | |
| | | | | | | 1 | 1 | 0 | 1 | | | | 100 | 4 | |
| X | 0 | 0 | 0 | 0 | 0 | X | 0 | X | X | 1 | X | X | 010 | 1 | WHEN 14NWD=-1 OR LESS AND CONTROLLING SIGNAL IS "INCREASE" |
| | | | | | | X | 1 | 0 | X | | | | 100 | 2 | |
| | | | | | | 0 | 1 | 1 | X | DITTO | | | 001 | 3 | |
| | | | | | | 1 | 1 | 1 | 0 | | | | 000 | 4 | |
| | | | | | | 0 | X | X | X | X | 1 | X | 001 | 1 | WHEN 14NWD=-1 OR LESS AND CONTROLLING SIGNAL IS "BALANCE" |
| | | | | | | 1 | 0 | X | X | | | | 010 | 2 | |
| | DITTO | | | | | 1 | 1 | 0 | X | DITTO | | | 100 | 3 | |
| | | | | | | 1 | 1 | 1 | 0 | | | | 000 | 3 | |
| | | | | | | X | X | X | 0 | X | X | 1 | 000 | 1 | WHEN 14NWD=-1 OR LESS AND CONTROLLING SIGNAL IS "DECREASE" |
| | | | | | | 0 | X | X | 1 | | | | 001 | 2 | |
| | | | | | | 1 | 0 | X | 1 | DITTO | | | 010 | 3 | |
| | | | | | | 1 | 1 | 0 | 1 | | | | 100 | 4 | |

FIG. 15C
TRUTH TABLE FOR PLA 43

| CWLL | 14 NWD | | | | INHIBITION SIGNAL | | | | CONTROLLING SIGNAL | | | MARGIN BIT OUTPUT | PRIORITY ORDER | REMARKS |
|---|---|---|---|---|---|---|---|---|---|---|---|---|---|---|
| | ≤-1 | 0 | 1 | 2 | +3≤ | 001 | 010 | 100 | 000 | + | 0 | - | | | |
| 1 | X | 0 | 0 | 0 | 1 | X | X | X | 0 | 0 | X | X | 000 | 1 | WHEN 14NWD=+3 OR MORE AND CONTROLLING SIGNAL IS "DECREASE" OR "BALANCE" |
| | | | | | | X | X | 0 | 1 | | | | 100 | 2 | |
| | | | | | | X | 0 | 1 | 1 | | DITTO | | 010 | 3 | |
| | | | | | | 0 | 1 | 1 | 1 | | | | 001 | 4 | |
| | DITTO | | | | | X | 0 | X | X | 1 | X | X | 010 | 1 | WHEN 14NWD=3 OR MORE AND CONTROLLING SIGNAL IS "INCREASE" |
| | | | | | | 0 | 1 | X | X | | | | 001 | 2 | |
| | | | | | | 1 | 1 | 0 | X | | DITTO | | 100 | 3 | |
| | | | | | | 1 | 1 | 1 | 0 | | | | 000 | 3 | |
| | X | 0 | 0 | 1 | 0 | X | X | 0 | X | 0 | X | X | 100 | 1 | WHEN 14NWD=2 AND CONTROLLING SIGNAL IS "DECREASE" OR "BALANCE" |
| | | | | | | X | X | 1 | 0 | | | | 000 | 2 | |
| | | | | | | X | 0 | 1 | 1 | | DITTO | | 010 | 2 | |
| | | | | | | 0 | 1 | 1 | 1 | | | | 001 | 3 | |
| | DITTO | | | | | X | X | X | 0 | 1 | X | X | 000 | 1 | WHEN 14NWD=2 AND CONTROLLING SIGNAL IS "INCREASE" |
| | | | | | | X | 0 | X | 1 | | | | 010 | 1 | |
| | | | | | | 0 | 1 | X | 1 | | DITTO | | 001 | 2 | |
| | | | | | | 1 | 1 | 0 | 1 | | | | 100 | 3 | |
| | X | 0 | 1 | 0 | 0 | X | X | 0 | X | X | X | 1 | 100 | 1 | WHEN 14NWD=1 AND CONTROLLING SIGNAL IS "DECREASE" |
| | | | | | | X | 0 | 1 | X | | | | 010 | 2 | |
| | | | | | | 0 | 1 | 1 | X | | DITTO | | 001 | 3 | |
| | | | | | | 1 | 1 | 1 | 0 | | | | 000 | 3 | |
| | DITTO | | | | | X | 0 | X | X | X | 1 | X | 010 | 1 | WHEN 14NWD=1 AND CONTROLLING SIGNAL IS "BALANCE" |
| | | | | | | 0 | 1 | X | X | | | | 001 | 2 | |
| | | | | | | 1 | 1 | 0 | X | | DITTO | | 100 | 2 | |
| | | | | | | 1 | 1 | 1 | 0 | | | | 000 | 2 | |
| | DITTO | | | | | X | X | X | 0 | 1 | X | X | 000 | 1 | WHEN 14NWD=1 AND CONTROLLING SIGNAL IS "INCREASE" |
| | | | | | | 0 | X | X | 1 | | | | 001 | 1 | |
| | | | | | | 1 | 0 | X | 1 | | DITTO | | 010 | 2 | |
| | | | | | | 1 | 1 | 0 | 1 | | | | 100 | 3 | |

FIG. 15D

TRUTH TABLE FOR PLA 43

| CWLL | 14NWD | | | | | INHIBITION SIGNAL | | | | CONTROLLING SIGNAL | | | MARGIN BIT OUTPUT | PRIORITY ORDER | REMARKS |
|---|---|---|---|---|---|---|---|---|---|---|---|---|---|---|---|
| | ≤-1 | 0 | 1 | 2 | +3≤ | 001 | 010 | 100 | 000 | + | 0 | - | | | |
| 1 | X | 1 | 0 | 0 | 0 | X | X | 0 | X | X | X | 1 | 100 | 1 | WHEN 14NWD=0 AND CONTROLLING SIGNAL IS "DECREASE" |
| | | | | | | X | 0 | 1 | X | | | | 010 | 2 | |
| | | | | | | 0 | 1 | 1 | X | DITTO | | | 001 | 3 | |
| | | | DITTO | | | 1 | 1 | 1 | 0 | | | | 000 | 4 | |
| | | | | | | X | 0 | X | X | X | 1 | X | 010 | 1 | WHEN 14NWD=0 AND CONTROLLING SIGNAL IS "BALANCE" |
| | | | | | | 0 | 1 | X | X | | | | 001 | 1 | |
| | | | DITTO | | | 1 | 1 | 0 | X | DITTO | | | 100 | 2 | |
| | | | | | | 1 | 1 | 1 | 0 | | | | 000 | 2 | |
| | | | | | | X | X | X | 0 | 1 | X | X | 000 | 1 | WHEN 14NWD=0 AND CONTROLLING SIGNAL IS "INCREASE" |
| | | | | | | 0 | X | X | 1 | | | | 001 | 2 | |
| | | | | | | 1 | 0 | X | 1 | DITTO | | | 010 | 3 | |
| | | | | | | 1 | 1 | 0 | 1 | | | | 100 | 4 | |
| | X | 0 | 0 | 0 | 0 | X | 0 | X | X | X | X | 1 | 010 | 1 | WHEN 14NWD=-1 OR LESS AND CONTROLLING SIGNAL IS "DECREASE" |
| | | | | | | X | 1 | 0 | X | | | | 100 | 2 | |
| | | | | | | 0 | 1 | 1 | X | DITTO | | | 001 | 3 | |
| | | | | | | 1 | 1 | 1 | 0 | | | | 000 | 4 | |
| | | | | | | 0 | X | X | X | X | 1 | X | 001 | 1 | WHEN 14NWD=-1 OR LESS AND CONTROLLING SIGNAL IS "BALANCE" |
| | | | | | | 1 | 0 | X | X | | | | 010 | 2 | |
| | | | DITTO | | | 1 | 1 | 0 | X | DITTO | | | 100 | 3 | |
| | | | | | | 1 | 1 | 1 | 0 | | | | 000 | 3 | |
| | | | | | | X | X | X | 0 | 1 | X | X | 000 | 1 | WHEN 14NWD=-1 OR LESS AND CONTROLLING SIGNAL IS "INCREASE" |
| | | | | | | 0 | X | X | 1 | | | | 001 | 2 | |
| | | | | | | 1 | 0 | X | 1 | DITTO | | | 010 | 3 | |
| | | | | | | 1 | 1 | 0 | 1 | | | | 100 | 4 | |

MODULATOR CIRCUIT FOR A RECORDING FOR A DIGITAL RECORDING MEDIUM

BACKGROUND OF THE INVENTION

1. Field of the Invention

This invention relates to a modulator circuit for a recording system for recording a digital audio signal or a like signal, and more particularly to a demodulator circuit, for example, for a compact disk (CD) recording and reproducing apparatus of the after writing type or the reloadable type in conformity to the compact disk system, which is applied for control of a digital sum variation (DSV) of channel coding.

2. Description of the Prior Art

In recording of a digital audio signal or a like signal, a digital signal is supplied, after an error detection correction code is added thereto, to a modulator circuit, in which it is converted into a code (channel code) suitable for a characteristic of a recording and reproducing system.

FIG. 1A shows an outline of a format of signals of the compact disk system. The 8-14 modulation (hereinafter referred to as EFM) is employed as a modulating system.

According to the EFM, input 8-bit codes (hereinafter referred to as symbols) are individually converted into codes of 14-channel bits, and then a synchronizing signal of 24-channel bits and a sub code of 14-channel bits are added to the 14-channel bit codes, whereafter each adjacent ones of the codes are connected by margin bits of 3-channel bits and then recorded in the NRZI system.

FIG. 1B shows construction of a frame of the CD system. Referring to FIG. 1B, in the period of one synchronization frame (a section of 6 sample values, each 6 samples for L- and R-channels, one sample consists of 16 bit data), data of 24 symbols and a parity of 8 symbols inputted from a CIRC (cross interleave Reed Solomon code) encoder to a modulator circuit are individually converted into 14-channel bits, each adjacent ones of which are connected by margin bits of 3-channel bits to make up 588-channel bits for one frame as shown in FIG. 1B. The 588-channel bits are NRZI recorded at the channel bit rate of 4.3218 Mbps onto a compact disk.

Here, each symbol inputted to the modulator circuit is converted, for example, by referring to a lookup table ROM, into a channel bit pattern wherein the number of "0" between "1" and "1" is equal to or greater than 2 but equal to or less than 10. Meanwhile, the channel bit pattern of the frame synchronizing signal Sf is "100000000001000000000010", and each margin bit pattern is selected from among "000", "001", "010" and "100". Further, one sub coding frame is constituted from 98 frames, and sub code synchronizing signals $S_0$ (="00100000000001" and $S_1$ (="00000000010010" are added as sub codes for the 0th and first frames, respectively (refer to FIG. 1C).

FIG. 2 shows channel bit patterns and a DSV (digital sum variation) after EFM of a certain sample value. Referring to FIG. 2, one sample of 16 bits is divided into upper 8 bits and lower 8 bits and is inputted by way of a CIRC encoder into a modulator circuit, in which it is 8-14 modulated into information bits. As described above, two or more but ten or less "0"s are present between "1" and "1" of the information bits. One of "000", "001", "010" and "100" is selected as margin bits such that the rule always applies to a location at which adjacent information bits are connected. Thus, an EFM signal which includes a unit of 17-channel bits (except the frame synchronizing signal Sf which includes 27-channel bits) is outputted at 4.3218 Mbps from the modulator circuit.

Since two or more but ten or less channel bits of "0" are present between an arbitrary channel bit "1" and a next channel bit "1" in this manner, the continuing period (recording wavelength) of the high level or the low level of a NRZI recording waveform is equal to or greater than 3T but equal to or less than 11T without fail (refer to FIG. 2). In other words, in this instance, the minimum recording wavelength is 3T and the maximum recording wavelength is 11T. This will be hereinafter referred to as EFM 3T to 11T rule. Here, T is one period of the channel clocks 4.3218 MHz.

As an index to a DC balance of a NRZI recording waveform, a digital sum variation (DSV) is considered here. A DSV is given as a time integration of a recording waveform. In particular, a variation of the DSV when the high level of a recording waveform continues for a unit time T is defined as $+1$, and another variation of the DSV when the low level continues for the unit time T is defined as $-1$.

A variation of a DSV with respect to time when it is assumed that the initial value of the DSV at the time $t_0$ is equal to 0 is shown at the lowermost stage of FIG. 2. Here, a modulation signal for the period from $t_1$ to $t_2$ does not decisively depend upon the 17-channel bit pattern "01000001000001001", but depends upon the level of the demodulation signal at the time $t_1$, in short, upon the last level (hereinafter referred to as CWLL) of the modulation signal waveform for the period from $t_0$ to $t_1$. Accordingly, the modulation signal waveform shown in FIG. 2 is a modulation signal waveform when the CWLL is at the low level (CWLL="0") at the time $t_0$, and the modulation signal waveform when the CWLL is CWLL="1" (high level) at the time $t_0$ presents an opposite pattern in which the high level and the low level are replaced from those of the former pattern. Similarly, an increase or a decrease of the DSV depends upon the CWLL, and when the CWLL is CWLL="0" at the time $t_0$, the variation of the DSV by the information bit pattern "01000100100010" (such variation will be hereinafter referred to as 14NWD), in short, the variation of the DSV for the period from $t_0$ to $t_{0+14}$, is $+2$ as seen from FIG. 2. If the CWLL is CWLL="1" at the time $t_0$ contrary to the illustration of FIG. 2, then the 14NWD is 14NWD=$-2$. Further, a variation of the DSV for the period from $t_{0+14}$ to $t_{1+14}$ is hereinafter referred to as 17NWD.

Margin bits to be inserted in the period between $t_{0+14}$ and $t_1$ will be describes subsequently.

Of the four kinds or patterns of margin bits "000", "001", "010" and "100", the margin bit patterns "001" and "100" cannot be inserted in accordance with the EFM 3T to 11T rule, but the margin bit patterns "010" or "000" can be inserted. In particular, if the quantity of "0" at the rear end of the preceding information bit pattern outputted prior to the margin bits is presented by B and the quantity of 0 at the front end of the present information bit pattern to be outputted subsequently is represented by A, then since B=1 and A=1, the front end of the margin bit pattern to be inserted must be "0" and the last end of the margin bit pattern must be "0", and accordingly, the margin bit pattern which can be inserted is "0×0".

The DSV when "010" is inserted as the margin bit pattern is indicated by a solid line while the DSV when "000" are inserted is indicated by a broken line in FIG. 2.

When addition of two of more of the four margin bit patterns is available, one of the available margin bit patterns is selected so that the DSV may be minimized with the 14NWD of the present information bits. In particular, since the DSV at the time $t_{1+14}$ is $+3$ with the margin bit pattern of "010" and $-1$ with the margin bit pattern of "000", the margin bit pattern "000" is selected as an optimum margin bit pattern and the margin bits "000" are added in the period between $t_{0+14}$ and $t_1$.

As described above, a margin bit pattern or patterns are first selected so that they may satisfy the EFM 3T to 11T rule at a connecting point between the information bit patterns, and then if a plurality of margin bit patterns can be inserted, then such a margin bit pattern is selected as will cause the DSV to approach zero most among them.

FIG. 3 is a block diagram of a modulator circuit disclosed in Japanese Patent Laid-Open Application No. 1-319178. Referring to FIG. 3, the modulator circuit shown has an input terminal 101 for receiving symbols from a CIRC encoder not shown, another input terminal 102 for receiving system clocks Sc of 4.3218 MHz, a further input terminal 103 for receiving a frame synchronizing timing signal, and a still further input terminal 104 for receiving a synchronizing timing signal for a sub coding frame.

Symbols successively inputted to the input terminal 101 are each 8-14 modulated by a ROM 111 and stored into a register 112, and two 4-bit data A and B representative of the numbers of "0" at the front end and the rear end of each 14 bit data are stored into the register 112.

At a synchronization timing of each frame and a synchronization timing of a sub coding frame, a false frame synchronizing signal S'f and sub coding frame synchronizing signals $S_0$ and $S_1$ are individually outputted as 14-bit data from a ROM 116 under the control of a system controlling circuit 115 and stored into the register 112. Here, the 14-bit false frame synchronizing signal S'f (=100000000001000" is temporarily determined as a frame synchronizing signal Sf of 24 bits, and this is converted, upon outputting, into a frame synchronizing signal Sf of 24 bits. Further, two 4-bit data A and B representative of the numbers of "0" at the front end and the rear end of the synchronizing signals S'f, S0 and S1 are stored into the register 112.

The 14 bit data stored in the register 112 are successively transferred to registers 113 and 114. Consequently, the last 14-bit data are stored in the register 113, and the second last 14-bit data are stored in the register 114. The 4-bit data A are supplied from the register 112 to a pair of ROMS 117 and 118, and the 4-bit data B are transferred from the register 112 to the register 113. Consequently, the last 4-bit data B are supplied from the resister 113 to the ROMs 117 and 118.

The ROM 117 receives the 4-bit data A and the last 4-bit data B as address input data and outputs a margin bit pattern which satisfies the EFM 3T to 11T rule to a selector 120. In the case of an exceptional combination (11 combinations are possible) which does not violate the EFM 3T to 11T rule but will result in production, in a bit pattern produced by connection of the margin bits, of a bit pattern same as the 24-bit frame synchronizing signal Sf, the ROM 18 outputs another margin bit pattern which is limited particularly so that such a combination may not occur. In other words, the ROM 118 outputs a margin bit pattern upon occurrence of an exceptional violation of the rule to the selector 120.

A detecting circuit 119 refers to the three 14-bit data stored in the registers 112, 113 and 114 and the last margin bits stored in a register 142 to detect occurrence of an exceptional combination described above and changes over read-out of margin bits from the ROM 117 to the ROM 118. Margin bits outputted from the ROM 117 or the ROM 118 are inputted as an address to a ROM 122 by way of the selector 120. Meanwhile, the 14-bit data are inputted as an address from the register 112 to the ROM 123.

The ROM 122 outputs a DSV corresponding to the margin bits inputted thereto and a polarity of the DSV, and the DSV is stored into a DSV register 125 while the polarity is stored into a polarity register 127. Meanwhile, the ROM 123 outputs a DSV corresponding to the 14-bit data inputted thereto and a polarity of the DSV, and the DSV is stored into a DSV register 124 and the polarity is stored into a polarity register 126.

The pattern of the margin bits outputted from the ROM 117 or 118 is one of four margin bit patterns (each hereinafter referred to as first, second, third or fourth margin bits or bit pattern) to the utmost, but in order to assure the unification of processing, always the margin bits of the four margin bit patterns are outputted. An optimum margin bit pattern among them is determined in the following manner.

(1) Test of First Margin Bit Pattern

Under the control of the selector 121, the selector 120 supplies the margin bits of the first margin bit pattern as an address input to the ROM 122. A DSV corresponding to the first margin bit pattern outputted from the ROM 122 and a polarity of the DSV are stored into the registers 125 and 127, respectively. Simultaneously, a DSV corresponding to 14-bit data outputted from the ROM 123 and a polarity of the DSV are stored into the registers 124 and 126, respectively.

A polarity of a cumulative DSV outputted from the register 130 is supplied by way of a logic circuit 131 to an adding/subtracting circuit 128, at which the calculation of the input B plus the input A is performed when the polarity is the negative, but the calculation of the input B minus the input A is calculated when the polarity is the positive. Here, the input B is a cumulative DSV supplied from the register 129, and the input A is a DSV supplied from the register 125 and corresponding to the first margin bits. A result of the calculation of the adding/subtracting circuit 128, that is, a cumulative DSV when the first margin bits are added, is stored into a register 132. Further, an absolute value of the result of the calculation is stored into another register 135 by way of an absolute value circuit 134.

Subsequently, the cumulative DSV stored in the register 132 for the case when the first margin bits are added is supplied as the input B to the adding/subtracting circuit 128, and the DSV stored in the register 124 and corresponding to the 14-bit data is supplied as the input A to the adding/subtracting circuit 128. Thus, addition or subtraction between the input B and the input A is performed at the adding/subtracting circuit 128. Here, a calculation controlling signal for addition or subtraction is supplied from the logic circuit 131 as an exclusive OR between the cumulative DSV stored in the register 130 and the polarity of the first margin bits stored in the register 127.

A result of the calculation at the adding/subtracting circuit 128 and an absolute value of the result are stored into the register 132 and the register 135, respectively.

The logic circuit 131 calculates an exclusive OR among the three polarities stored in the registers 126, 127 and 130, and a result of the calculation is stored into a register 138.

A sequential number of the margin bit pattern used for the calculation of the cumulative DSV stored in the register 132 (here the number is "1" representative of the first margin bit pattern) is stored into an indicator 140.

(2) Test of Second Margin Bit Pattern

Under the control of the selector 121, the second margin bits are inputted as an address to the ROM 122 from the selector 120, and a DSV of the second margin bits and a polarity of the DSV outputted from the ROM 122 are stored into the registers 125 and 127, respectively.

The calculation of a cumulative DSV by the adding-/subtracting circuit 128 when the second margin bits are added is performed in a similar manner as in the calculation when the first margin bits are added. In the case of the second and following margin bits, a result of the calculation and an absolute value of the result are stored, differently from those of the case of the first margin bits (i.e., not into the registers 132 and 135), into the register 133 and the register 136, respectively.

The calculation of a cumulative DSV by the adding-/subtracting circuit 128 when 14-bit data are added and wherein the cumulative DSV stored in the register 133 when the second margin bits are added is used as the input B is performed similarly as in the case of the first margin bits, and in the case of the calculation of the second and following margin bits, a result of the calculation and an absolute value of the result are stored into the register 133 and the register 136, respectively.

Subsequently, it is judged whether or not the present margin bits are more suitable than the margin bits already tested. Since margin bits are selected so that they may cause the absolute value of the cumulative DSV to approach zero as far as possible, the absolute value of the last cumulative DSV stored in the register 135 and the absolute value of the present cumulative DSV stored in the register 136 are compared with each other. In particular, the adding/subtracting circuit 128, which has been put into a subtracting mode under the control of the logic circuit 131, receives as the input B the absolute value of the cumulative DSV regarding the first margin bits supplied from the register 135 and receives as the input A the absolute value DSV regarding the second margin bits supplied from the register 136, and subtracts the input A from the input B.

When the result of the calculation is in the positive, that is, when the cumulative DSV of the second margin bits is nearer to zero than the cumulative DSV of the first margin bits, the contents of the register 133 are stored into the register 132, and an exclusive OR among the three polarities of the registers 126, 127 and 130 outputted from the logic circuit 131 is stored into the register 138. Further, the sequential number of the margin bit pattern used for the calculation of the cumulative DSV stored in the register 132 (the number here is "2" representative of the second margin bit pattern) is stored into the indicator 140. It is to be noted that, when the result of the subtraction is in the negative or equal to zero, such updating of the contents of the registers 132 and 138 and the indicator 140 as described above is not performed.

In this manner, a cumulative DSV when margin bits of an optimum margin bit pattern from among the margin bit patterns tested till then are used is stored in the register 132 and a polarity of the cumulative DSV is stored in the register 138, and a sequential number of the optimum margin bit pattern is stored in the indicator 140.

(3) Test of Third Margin Bit Pattern

Quite similar processing to that of the case of the second margin bit pattern is performed also for the third margin bit pattern supplied by way of the selector 120. As a result, a cumulative DSV when margin bits of an optimum margin bit pattern from among the first to third margin bit patterns tested till then are used is stored in the register 132 and a polarity of the cumulative DSV is stored in the register 138, and a sequential number of the optimum margin bit pattern is stored in the indicator

(4) Test of Fourth Margin Bit Pattern

Quite similar processing to that of the cases of the second and third margin bits is performed also for the fourth margin bit pattern supplied by way of the selector 120. As a result, a cumulative DSV when margin bits of an optimum margin bit pattern from among all of the margin bit patterns are used is stored in the register 132 and a polarity of the cumulative DSV is stored in the register 138, and a sequential number of the optimum margin bit pattern is stored in the indicator 140.

Optimum margin bits are found out as a result of the tests (1) to (4) described above, and subsequently, outputting processing is performed.

The sequential number of the optimum margin bit pattern stored in the indicator 140 is supplied to the selector 120 by way of the selector 121, and the selector 120 selects optimum margin bits from margin bits inputted from the ROM 117 or 118 and outputs the same to a register 141. Further, the cumulative DSV stored in the register 132 when the optimum margin bits are used is stored into the cumulative DSV register 129 and the polarity stored in the register 138 is stored into the cumulative polarity register 130 to effect updating of the cumulative registers 129 and 130.

Selection and outputting of optimum margin bits corresponding to the present 14-bit data stored in the register 112 are completed in this manner, and then next 14-bit data and two 4-bit data A and B are outputted from the ROM 111 or the ROM 116 and stored into the register 112. Simultaneously, the optimum margin bits stored in the register 141 and corresponding to the present 14-bit data are transferred to and stored into the register 142.

The present 14-bit data outputted from the register 113 are connected to the optimum margin bits outputted from the register 142 to make 17-bit data, and the 17-bit data are loaded into a shift register 143 of the parallel-in/serial-out type. Then, in a subsequent period of 17 system clocks (Sc), the 17-bit data are outputted as serial data of 17-channel bits to an exclusive OR (XOR) circuit 144. The exclusive OR circuit 144 converts, in response to a frame synchronizing timing signal supplied thereto from the input terminal 102 by way of the system controlling circuit 115, the false frame synchronizing signal S'f of 14 bits from among the serial data inputted thereto from the shift register 143 into the regular frame synchronizing signal of 24 bits and outputs the regular frame synchronizing signal as an EFM signal at 4.3218 Mbps by way of a flip-flop circuit 145.

In the conventional circuit described above, resetting of the cumulative DSV register 129 and the cumulative polarity register 130 is performed for each sub coding frame (in short, for each 98 synchronizing frames) in order to prevent a possible overflow of a cumulative DSV.

As described above, in the conventional modulator circuit, since lookup ROMS, registers and like circuit components are used by a great number for 8-14 conversion, for margin bit selection and so forth, the construction of the modulator circuit is complicated and is great in scale, and accordingly, there is a drawback that large scale integration of them is difficult.

Meanwhile, as audio apparatus of the CD type, recordable CD apparatus, that is, so-called minidisks, have been proposed. Since such a digital recording and reproducing apparatus must have a built-in modulator circuit therein as different from a conventional apparatus designed only for reproduction, the drawback described above is a serious obstacle to miniaturization and reduction in weight of the apparatus.

Further, in the conventional modulator circuit, a cumulative DSV and a polarity of the same are actually calculated for each of the four margin bit patterns, and optimum margin bits are selected from the result of the calculation. However, since applicable margin bits are limited by the EFM 3T to 11T rule and a frame synchronizing signal must not be generated in error, ideal control of the cumulative DSV (control to cause the cumulative DSV to always approach zero) may not always be possible. As a result, when the cumulative DSV is to be handled as finite word length data (for example, as 8-bit data), the value of the cumulative DSV sometimes exceeds a numerical value range (+127 to −128 in the present example) (this will be hereinafter referred to as overflow of the cumulative DSV), which puts the system into an uncontrollable condition. Therefore, in the conventional modulator circuit described above, it is necessary to reset the cumulative DSV for each sub coding frame (98 synchronization frames).

Again, in the conventional modulator circuit, since a cumulative DSV and a polarity of the same are actually calculated for each of the four margin bit patterns as described above and optimum margin bits are selected from the result of the calculation, for the selection of optimum margin bits, four tests must always be performed parallelly or repetitively in a time division condition. Accordingly, there is a drawback that the modulator circuit is complicated and large in scale. However, in the case of a CD system for only reproduction, the drawback described just above does not make a serious obstacle because the modulator circuit is used as part of a CD manufacturing system (for example, a laser cutting machine) of the large size.

On the other hand, the drawback described above is a serious obstacle with a recording and reproducing apparatus of the CD system such as a minidisk system which has been proposed recently because the recording and reproducing apparatus must have a modulator circuit of a small size built therein.

SUMMARY OF THE INVENTION

It is an object of the present invention to provide a modulator circuit which is reduced in scale so that it can be incorporated into a large scale integrated circuit.

It is another object of the present invention to provide a modulator circuit which can prevent an overflow of a cumulative DSV and can output a controlling signal for indicating a desirable controlling direction of the cumulative DSV to a margin bit generating circuit in accordance with the cumulative DSV thus calculated.

It is a further object of the present invention to provide a modulator circuit which can generate optimum margin bits decisively without performing a test.

In order to attain the objects, according to one aspect of the present invention, there is provided a modulator circuit wherein each input m-bit code is modulated into an n-channel bit pattern, n being greater than m, and two adjacent ones of such n-channel bit patterns are coupled to each other using one of a plurality of margin bit patterns to limit the longest and shortest recording wavelengths while suppressing low band components of a recording waveform, the modulator circuit comprising a first logic circuit for adding an n-bit false frame synchronizing signal having a bit pattern at least part of which is the same as part of a frame synchronizing signal in order to achieve unified judgment of one or ones of the margin bit patterns which are to be inhibited from use, and a second logic circuit for referring to the second last, the last and the present n-channel bit patterns and the last margin bit pattern to judge one or ones of the margin bit patterns which are to be inhibited from use in accordance with a predetermined algorithm and outputting an inhibition signal representative of the thus judged margin bit pattern or patterns.

The modulator circuit is shown in FIG. 4. Referring to FIG. 4, 8-bit data successively supplied to an input terminal 10 from a data generating circuit not shown are modulated into 14-bit data by an EFM ROM 11, and then supplied to a judging circuit 30 after a sub code synchronizing signal of 14 bits is added thereto.

In the judging circuit 30, a false frame synchronization adding circuit 13 adds a false frame synchronizing signal of 14 bits to the 14-bit data inputted thereto in response to a frame synchronization timing signal and outputs the last 14-bit data Db to a frame synchronization converting circuit 15 by way of a register 14. The false frame synchronization adding circuit 13 is constituted from a simple logic circuit and is designed so that, making use of the last 14-bit data, only the upper 1 bit and the lower 2 bits of the false frame synchronizing signal are identical with the upper 1 bit and the lower 2 bits, respectively, of a frame synchronizing signal of 24 bits.

An inhibited margin bit judging circuit 20 of the judging circuit 30 refers to the upper 12 bits of the present 14-bit data Dp, the last 14-bit data Db, the lower 2 bits of the second last 14-bit data Dbb and the last margin bits Mb, judges margin bits which are inhibited from use between the last and the present 14-bit data Db and Dp, and outputs an inhibition signal Sinh of 4 bits to a margin bit generating circuit 40. The inhibited margin bit judging circuit 20 is constituted from a logic circuit wherein the judgment algorithm is programmed in advance.

The frame synchronization timing signal 15 converts only the false frame synchronization signal from among 14-bit data inputted thereto into a frame synchronization signal of 24 bits and outputs the frame synchronization signal to a P/S register 16. The P/S register 16 converts the parallel input signal of 3, 14 or 24 bits into serial data in response to system clocks of 4.3218 MHz and outputs the serial data to a NRZI circuit 17. The NRZI circuit 17 modulates the serial data inputted thereto into an EFM signal.

A DSV integrating circuit 60 integrates a DC component of the EFM signal inputted in the unit of 17-channel bits obtained by connection of the margin bits Mp and the present 14-bit data Dp to obtain a cumulative DSV and outputs a controlling signal for indicating an increase, a balance or a decrease of the cumulative DSV to the margin bit generating circuit 40 in accordance with the cumulative DSV.

The margin bit generating circuit 40 decisively outputs, in accordance with the controlling signal, a 14NWD signal and a CWLL signal, margin bits Mp which have the highest priority order from among those margin bits which are permitted by the inhibition signal Sinh. The margin bits Mp are outputted to the P/S register 16 and also to a register 32 of the judging circuit 30 so as to produce a next inhibition signal Sinh.

Thus, since the modulator circuit comprises the logic circuit 12 for adding a false frame synchronization signal which is composed of bits only part of which is identical with a bit pattern of the frame synchronization signal and has a same bit length as the other 14-bit data, and the logic circuit 20 wherein the inhibition algorithm for judging inhibited margin bits in accordance with input signals Dp, Db, Dbb and Mb is programmed in advance, reduction in scale of the circuit can be realized and integration of the circuit can be achieved readily.

According to another aspect of the present invention, there is provided a modulator circuit wherein each input m-bit code is modulated into an n-channel bit pattern, n being greater than m, and two adjacent ones of such n-channel bit patterns are coupled to each other using one of a plurality of margin bit patterns to limit the longest and shortest recording wavelengths while suppressing low band components of a recording waveform, the modulator circuit comprising a digital sum variation measuring circuit for receiving an output signal of the modulator circuit and measuring a digital sum variation of each margin bit pattern and an n-channel bit pattern following the margin bit pattern, and an integrating circuit for receiving an output signal of the digital sum variation measuring circuit, integrating the digital sum variation with a finite dc gain to obtain a controlling signal regarding a cumulative digital sum variation and outputting the controlling signal to a margin bit generating circuit.

A DSV integrating circuit of the modulator circuit is shown in FIG. 8. Referring to FIG. 8, the DSV integrating circuit 60 includes an up/down (U/D) counter 65 which up counts system clocks Sc when an EFM signal is at the high level, but down counts the system clocks Sc when the EFM signal is at the low level. The U/D counter 65 thus counts a DSV of 17-channel bits including the unit of 3-channel margin bits and succeeding 14-channel bits (27-channel bits only in the case of a synchronizing frame signal), that is, a 17NWD. A result of the counting is stored into a register 66 in response to a timing signal. Simultaneously, the U/D counter 65 is reset for the counting of a next 17NWD. Here, the U/D counter 65 and the register 66 constitute a DSV measuring circuit 61.

The 17NWD stored in the register 66 is supplied to an integrating circuit 62, at which it is leaky integrated. A result of the integration (hereinafter referred to as cumulative DSV) is outputted to a local quantizing circuit 63. Here, the integrating circuit 62 is constituted from an adder 67, a delay circuit 68 and a coefficient circuit 69. Further, for the object of leaky integration, that is, for the prevention of divergence of the cumulative DSV, the coefficient $\alpha$ of the coefficient circuit 69 is set to a value smaller than 1 ($\alpha < 1$).

The local quantizing circuit 63 quantizes the cumulative DSV supplied thereto into the following three regions and outputs a controlling signal for indicating a desired controlling direction of the cumulative DSV to a margin bit generating circuit 40 (refer to FIG. 2).

First, when the absolute value of the cumulative DSV is equal to or smaller than a predetermined value Bd (Bd $\geq$ cumulative DSV $\geq$ $-$Bd), the cumulative DSV is considered to be substantially equal to zero, and a controlling signal "010" to instruct to avoid a variation of the cumulative DSV to the utmost at a next 17NWD is provided as a quantization output. Here, the predetermined value Bd defines a dead zone ($+$Bd to $-$Bd), by which the stability of the cumulative DSV controlling system is enhanced.

Second, when the cumulative DSV is higher than the predetermined value Bd (cumulative DSV $>$ Bd), since it is desirable to decrease the cumulative DSV (to approach zero) at a next 17NWD, a controlling signal "001" to instruct a "decrease" of the cumulative DSV is provided as a quantization output.

Third, when the cumulative DSV is smaller than the negative predetermined value Bd (cumulative DSV $<$ $-$Bd), since it is desirable to increase the cumulative DSV (to approach zero), a controlling signal "100" to instruct an "increase" of the cumulative DSV is provided as a quantization output.

According to a further aspect of the present invention, there is provided a modulator circuit wherein each input m-bit code is modulated into an n-channel bit pattern, n being greater than m, and two adjacent ones of such n-channel bit patterns are coupled to each other using one of a plurality of margin bit patterns to limit the longest and shortest recording wavelengths while suppressing low band components of a recording waveform, the modulator circuit comprising margin bit generating means for receiving a signal regarding one or ones of the margin bit patterns which are to be inhibited from use, a controlling signal regarding a last recording waveform level of an n-channel bit pattern placed prior to the margin bit pattern, another controlling signal regarding a cumulative digital sum variation and another controlling signal regarding another cumulative digital sum variation of another n-channel bit pattern placed subsequent to the margin bit pattern and outputting an optimum margin bit pattern from among the margin bit patterns decisively without depending upon a test.

A margin bit generating circuit of the modulator circuit is shown in FIG. 10. Referring to FIG. 10, the following input signals are inputted to the margin bit generating circuit 40. In particular, an inhibition signal of 4 bits, wherein an inhibition flag "1" is set at that one or ones of four margin bit patterns "100", "010", "001" and "000" which violate the EFM 3T to 11T rule and that one or ones of the four margin bit patterns which cause a frame synchronizing signal to be generated in error, is inputted from an inhibited margin bit judging circuit 20. A 3-bit controlling signal "100", "010" or "001" indicating that the desired controlling direction of a cumulative DSV is an increase (+), a balance (0) or a decrease (−) is inputted from a DSV integrating circuit 60. Further, a 1-bit signal ("0" at the low level, and "1" at the high level) representative of a last end signal level (hereinafter referred to as CWLL) of a NRZI waveform of 14-bit data placed prior to margin bits and a 5-bit signal representative of a DSV of 14-bit data Dp placed following the margin bits in the form of twos complement are supplied to the margin bit generating circuit 40.

The individual bits of the 4-bit inhibition signal correspond, for example, in the descending order. to the margin bits "001", "010", "100" and "000", and at a bit corresponding to each margin bit pattern which is inhibited in conformity to the EFM 3T to 11T rule or each margin bit with which a frame synchronizing signal is generated in error, the flag "1" is set. For example, when the quantity B of "0" at the rear end of 14-bit data Db placed prior to margin bits is 4 and the quantity A of "0" at the front end of 14-bit data Dp placed succeeding to the margin bits is 5, use of the margin bits "000" is inhibited in conformity to the EFM 3T to 11T rule, and a 4-bit inhibition signal "0001" is outputted from the inhibited margin bit judging circuit 20 to a programmable logic array (PLA) 43.

The 3-bit controlling signal ("1" at the first bit represents an increasing instruction "+" to increase the cumulative DSV; "1" at the second bit represents a balancing instruction "0" to keep the cumulative DSV; and "1" at the third bit represents a decreasing instruction "−" to decrease the cumulative DSV) inputted from the DSV integrating circuit 60 is supplied to the PLA circuit 43 by way of a decoder 41 using the CWLL signal as a gate signal. Here, the decoder 41 outputs to the PLA 43 a 3-bit controlling signal which is changed so that the PLA 43 may output optimum margin bits 44. In particular, in the case of CWLL="1", if the controlling signal inputted thereto is the increasing instruction "100", then the decoder 41 changes the increasing instruction "100" to the decreasing instruction "001", or if the controlling signal inputted thereto is the decreasing instruction "001", then the decoder 41 changes the decreasing instruction "001" to the increasing instruction "100", but if the controlling signal inputted thereto is the balancing instruction "010", then the decoder 41 does not change but outputs the balancing instruction as it is to the PLA 43.

A variation of a DSV of 14-bit data Dp, that is, a cumulative DSV when 14-bit data Dp are added to the margin bits (such variation will be hereinafter referred to as 14NWD) is represented in the form of twos complement of 5 bits and is inputted as a 14NWD signal to another decoder 42, at which it is subsequently decoded into the following 5 cases:

(1) In the case of 14NWD≧3, a 4-bit signal "1000" is outputted from the decoder 42 to the PLA 43.
(2) In the case of 14NWD=2, a 4-bit signal "0100" is outputted from the decoder 42 to the PLA 43.
(3) In the case of 14NWD=1, a 4-bit signal "0010" is outputted from the decoder 42 to the PLA 43.
(4) In the case of 14NWD=0, a 4-bit signal "0001" is outputted from the decoder 42 to the PLA 43.
(5) In the case of 14NWD≦−1, a 4-bit signal "0000" is outputted from the decoder 42 to the PLA 43.

The PLA 43 outputs optimum margin bits 44 decisively in accordance with a combination of the input signals of 11 bits (a 4-bit signal representative of inhibited margin bits, a 3-bit controlling signal for instructing a controlling direction of the cumulative DSV and a 4-bit signal representative of one of the five cases of the 14NWD).

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 1A to 1C are diagrammatic views showing a format of signals of a CD system;

FIG. 2 is a diagram illustrating sample values and an EFM signal:

FIGS. 6A and 6B are diagrammatic views illustrating algorithms for judgment of inhibited margin bits in the modulator circuit shown in FIG. 4;

FIG. 7 is a block diagram showing details of an inhibited margin bit judging circuit of the modulator circuit of FIG. 4 which employs the algorithms illustrated in FIGS. 6A and 6B:

FIGS. 14A and 14B are diagrammatic views showing truth tables for decoders of the modulator circuit shown in FIG. 4; and FIGS. 15A to 15D are diagrammatic views showing truth tables for a programmable logic array of the modulator circuit shown in FIG. 4.

DETAILED DESCRIPTION OF THE PREFERRED EMBODIMENT

Figure 3A:
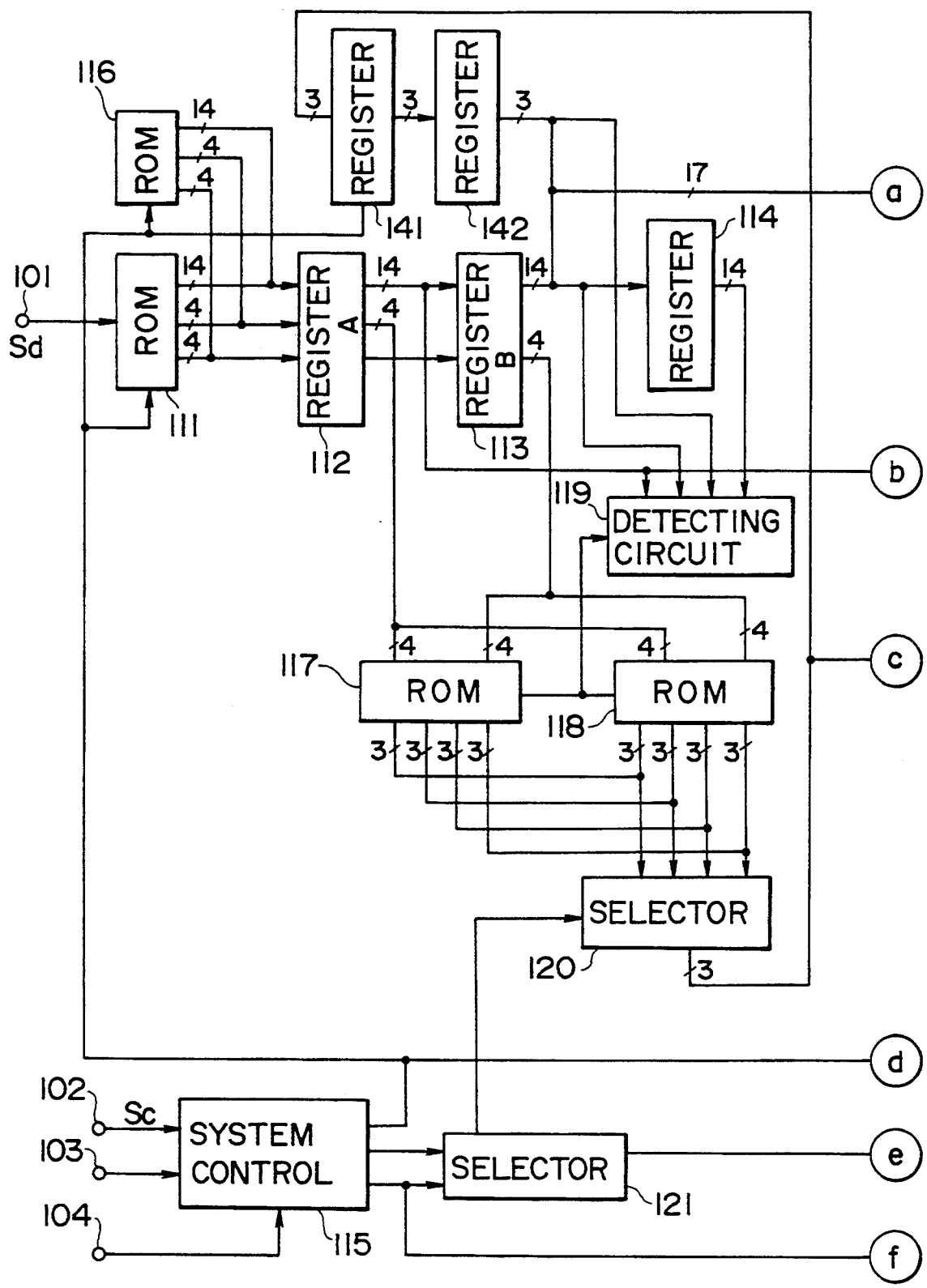
FIG. 3 is a block diagram showing a conventional modulator circuit.
Figure 3B:
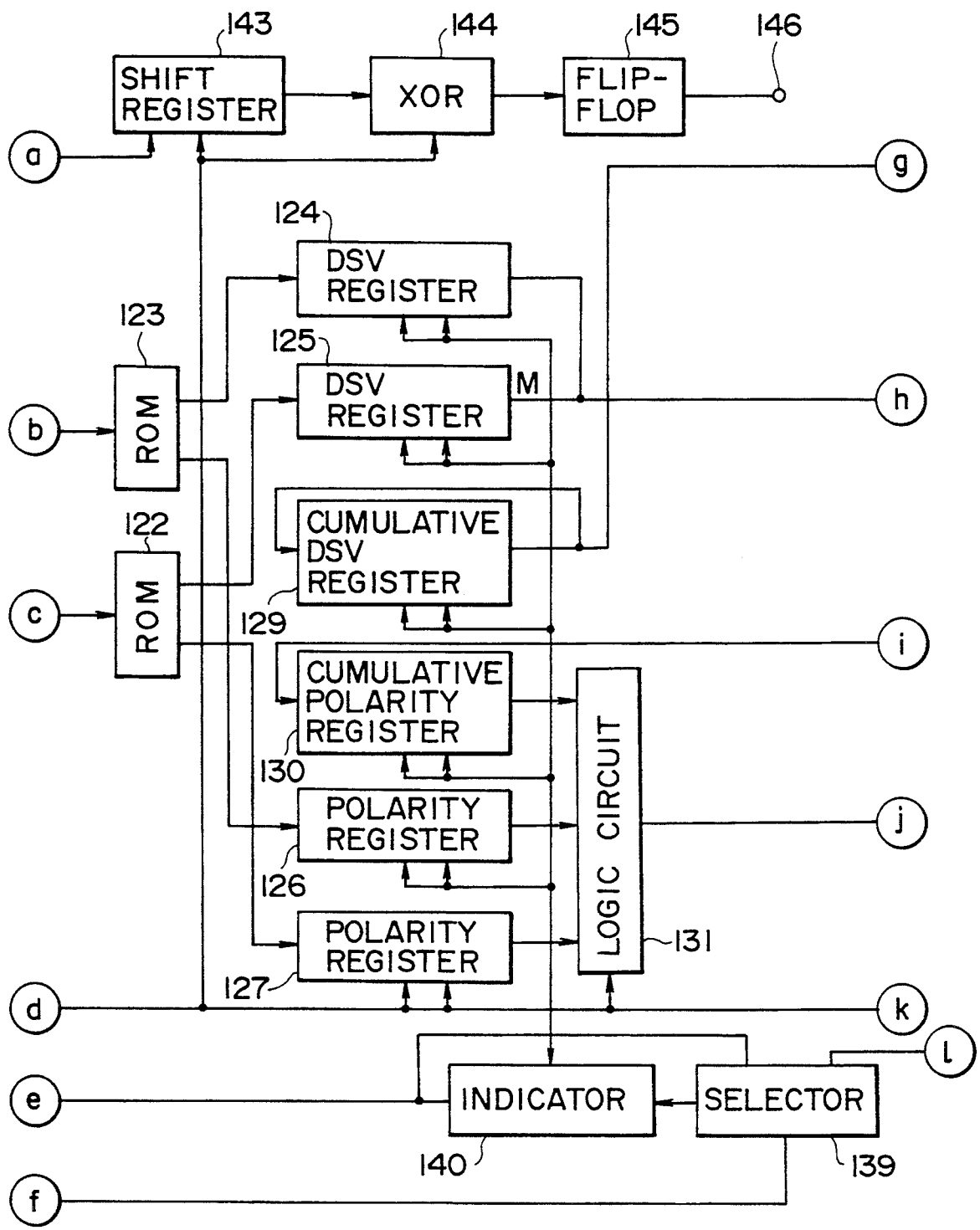
Figure 4:
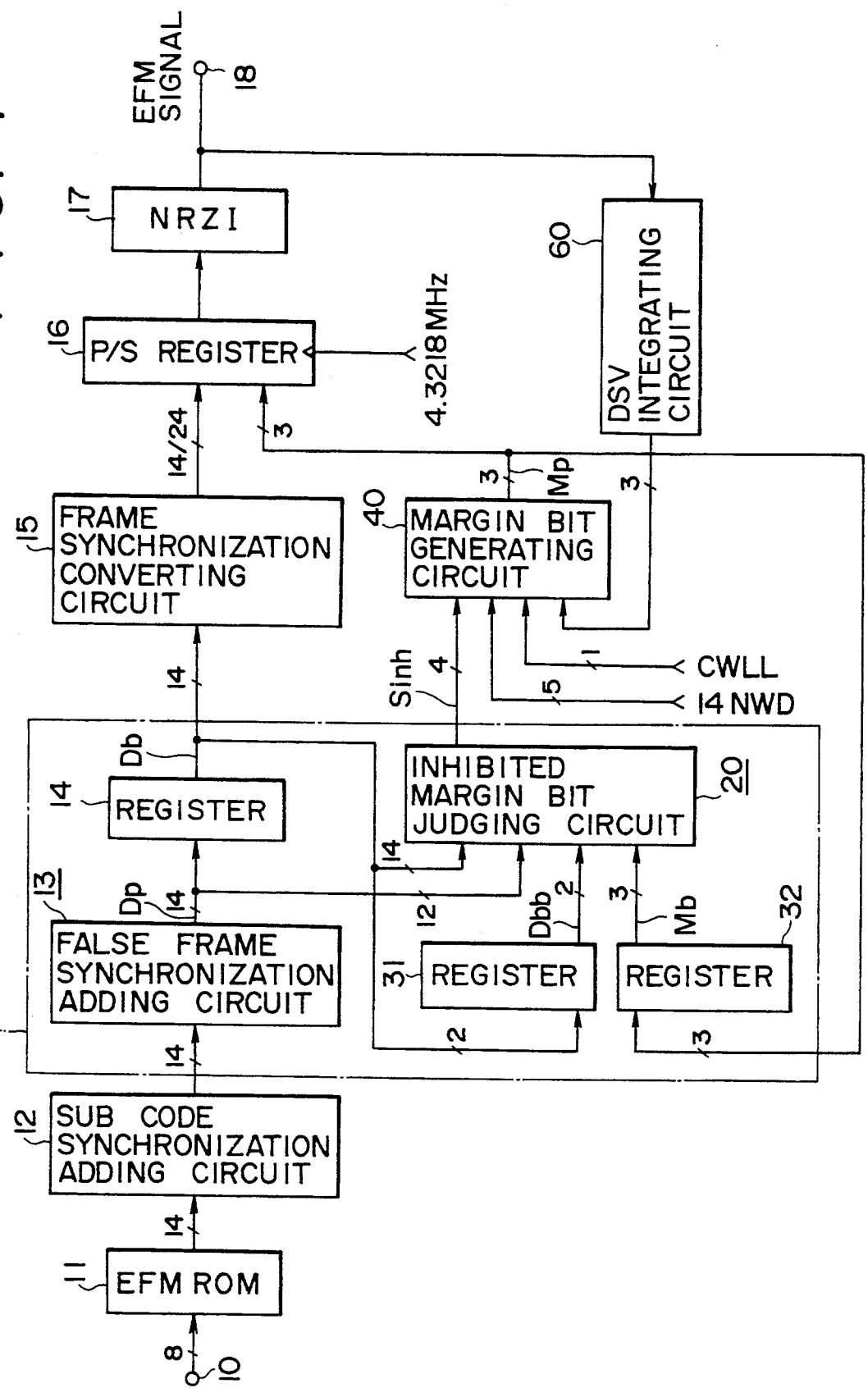
FIG. 4 is a block diagram of a modulator circuit showing a preferred embodiment of the present invention.

Referring first to FIG. 4, there is shown in block diagram a modulator circuit of a preferred embodiment of the present invention. The modulator circuit shown has an input terminal 10 to which data of 32 symbols per one synchronization frame are inputted as described hereinabove from a data generating circuit not shown. Each symbol of 8 bits is 8-14 modulated into 14-bit data by an EFM ROM 11 which serves as a lookup table ROM.

Sub code synchronizing signals $S_0$ and $S_1$ of 14 bits are added to the 0th and first synchronization frames, respectively, of 98 synchronization frames which constitute a sub coding frame. The addition of the sub code synchronizing signals $S_0$ and $S_1$ is performed by a sub code synchronization adding circuit 12 in response to a sub code synchronization timing signal not shown.

A false frame synchronization adding circuit 13 adds a false frame synchronizing signal S'f of 14 bits (="1xxxxxxxxxxx10") to the head of each synchronization frame in response to a frame synchronization timing signal not shown. Since the bit pattern of the first 1 bit and the last two bits of the false frame synchronizing signal S'f are the same as those of the regular frame synchronizing signal Sf of 24 bits (="100000000001000000000010"), when margin bits are to be selected, quite same processing for that of any other 14-bit data is possible.

Data Dp of 14 bits including the sub code synchronizing signals $S_0$ and $S_1$ and the false frame synchronizing signal S'f are successively supplied to and latched by a register 14, and the upper 12 bits of the 14-bit data Dp are supplied to an inhibited margin bit judging circuit 20. Simultaneously, the last 14-bit data Db which have been latched in the register 14 till then are outputted to a frame synchronization converting circuit 15 and the inhibited margin bit judging circuit 20, and the lower 2 bits of the 14-bit data Db are stored into a register 31. Formerly stored lower 2 bits, that is, the lower 2 bits of the second last 14-bit data Dbb, are supplied from the register 31 to the inhibited margin bit judging circuit 20. Meanwhile, present margin bits Mp supplied from a margin bit generating circuit 40 which will be hereinafter described are stored into another register 32. The formerly stored 3-bit data, in short, the last margin bits Mb, are supplied from the register 32 to the inhibited margin bit judging circuit 20.

The inhibited margin bit judging circuit 20 judges, based on the upper 12 bits of the present 14-bit data Dp, the last 14-bit data Db, the last margin bits Mb and the lower 2 bits of the second last 14-bit data Dbb, those margin bits which violate the EFM 3T to 11T rule and the exceptional inhibition rule and outputs the thus judged margin bits as an inhibition signal to the margin bit generating circuit 40. The inhibition signal consists of 4 bits which individually correspond to the four patterns of margin bits "100", "010", "001" and "000". For example, when the first and third margin bit patterns "100" and "001" are inhibited in accordance with the EFM 3T to 11T rule and the exceptional inhibition rule, the 4-bit inhibition signal is given by "1010".

Here, the false frame synchronization adding circuit 13, the registers 14, 31 and 32 and the inhibited margin bit judging circuit 20 constitute a judging circuit 30.

In particular, the judging circuit 30 of the modulator circuit according to the present invention receives as input signals thereto 14-bit data Dp supplied from the sub code synchronization adding circuit 12 and margin bits Mp supplied from the margin bit generating circuit 40 and outputs the last 14-bit data Db to the frame synchronization converting circuit 15 and further outputs to the margin bit generating circuit 40 an inhibition signal of 4-bits indicative of a margin bit pattern or patterns which must not be used for connection between the last 14-bit data Db and the present 14-bit data Dp.

Figure 5:
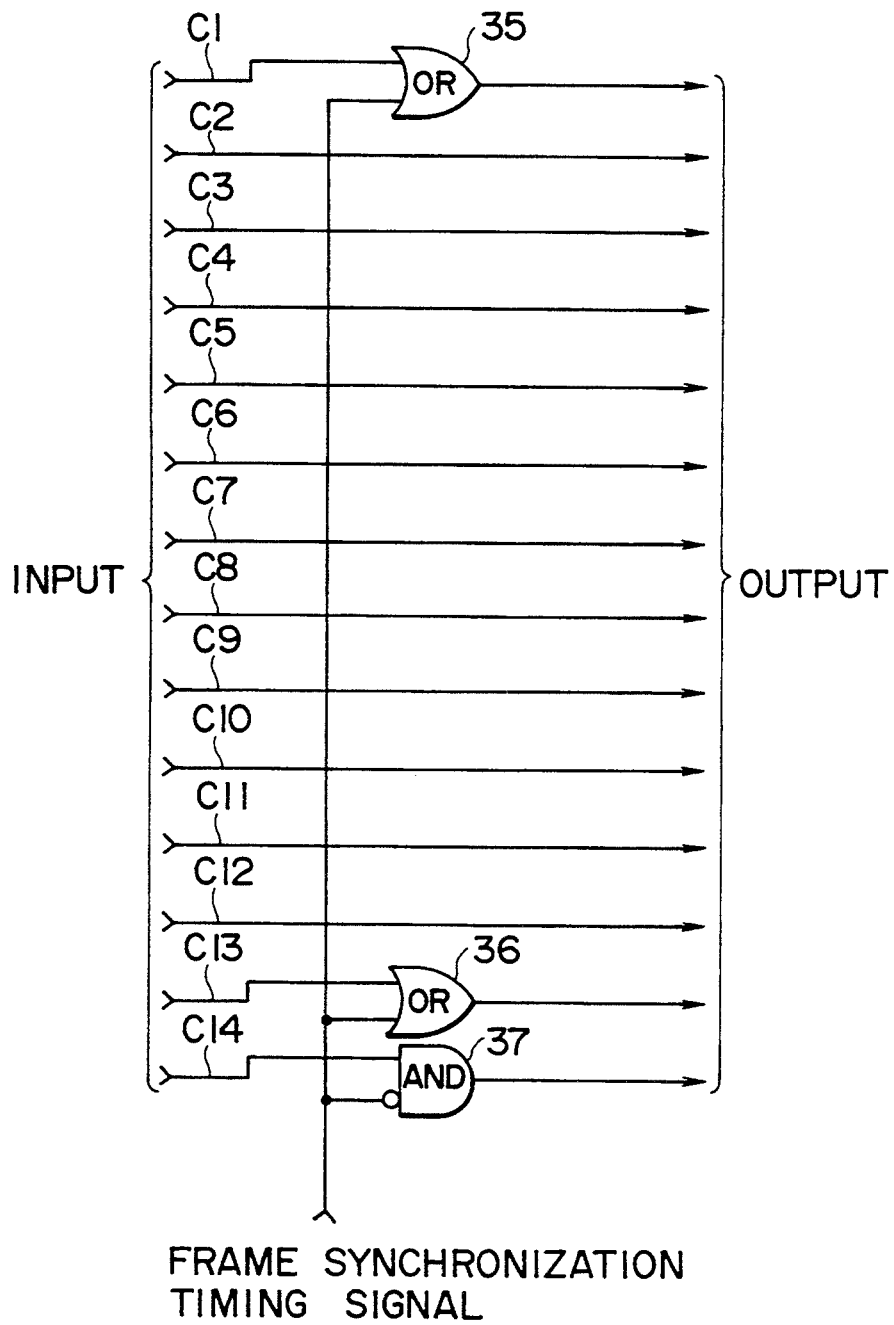
FIG. 5 is a circuit diagram showing details of a false frame synchronization adding circuit in the modulator circuit shown in FIG. 4.

FIG. 5 shows in block diagram details of an exemplary form of the false frame synchronization adding circuit 13 of the judging circuit 30. Referring to FIG. 5, the uppermost bit C1 of 14-bit data inputted from the sub code synchronization adding circuit 12 is outputted by way of an OR gate 35 and the thirteenth bit C13 is outputted by way of another OR gate 36 both to the register 14. Further, the lowermost bit C14 is outputted by way of an AND gate 37. Accordingly, when the level of the frame synchronization timing signal indicative of a timing at which the false frame synchronizing signal S'f is to be added is changed to "1", the false frame synchronization adding circuit 13 outputs 14-bit data Dp obtained by placement of "1", "1" and "0" into the uppermost bit C1, the thirteenth bit C13 and the lowermost bit C14 of the last 14-bit data, respectively, as the false frame synchronizing signal S'f (=1xxxxxxxxxxx10"). Here, the uppermost bit C1 and the two lowermost bits C13 and C14 of the false frame synchronizing signal S'f are equal to the uppermost bit C1 and the two lowermost bits C23 and C24 of the frame synchronizing signal Sf, respectively.

Figure 6A:
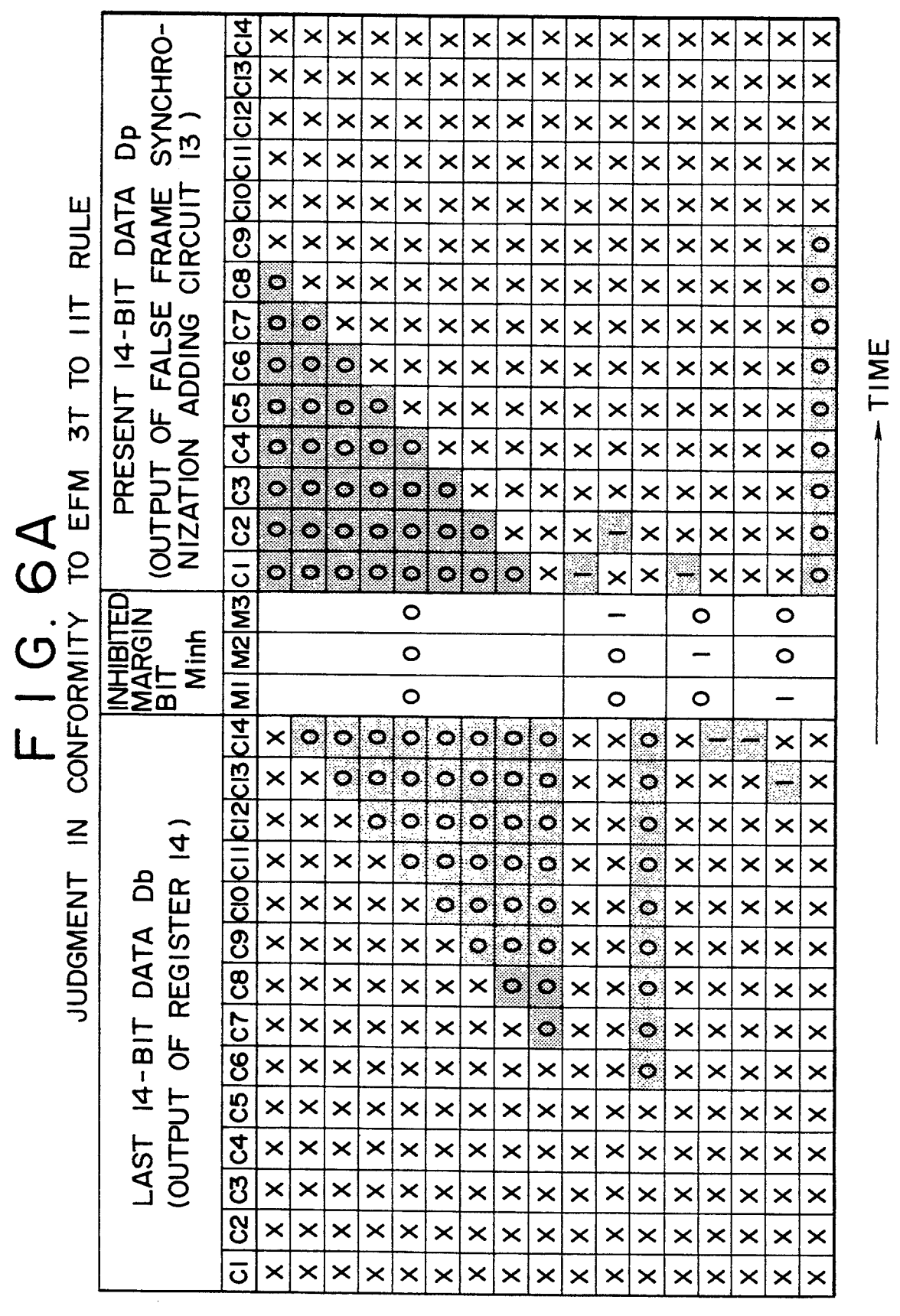
Figure 6B:
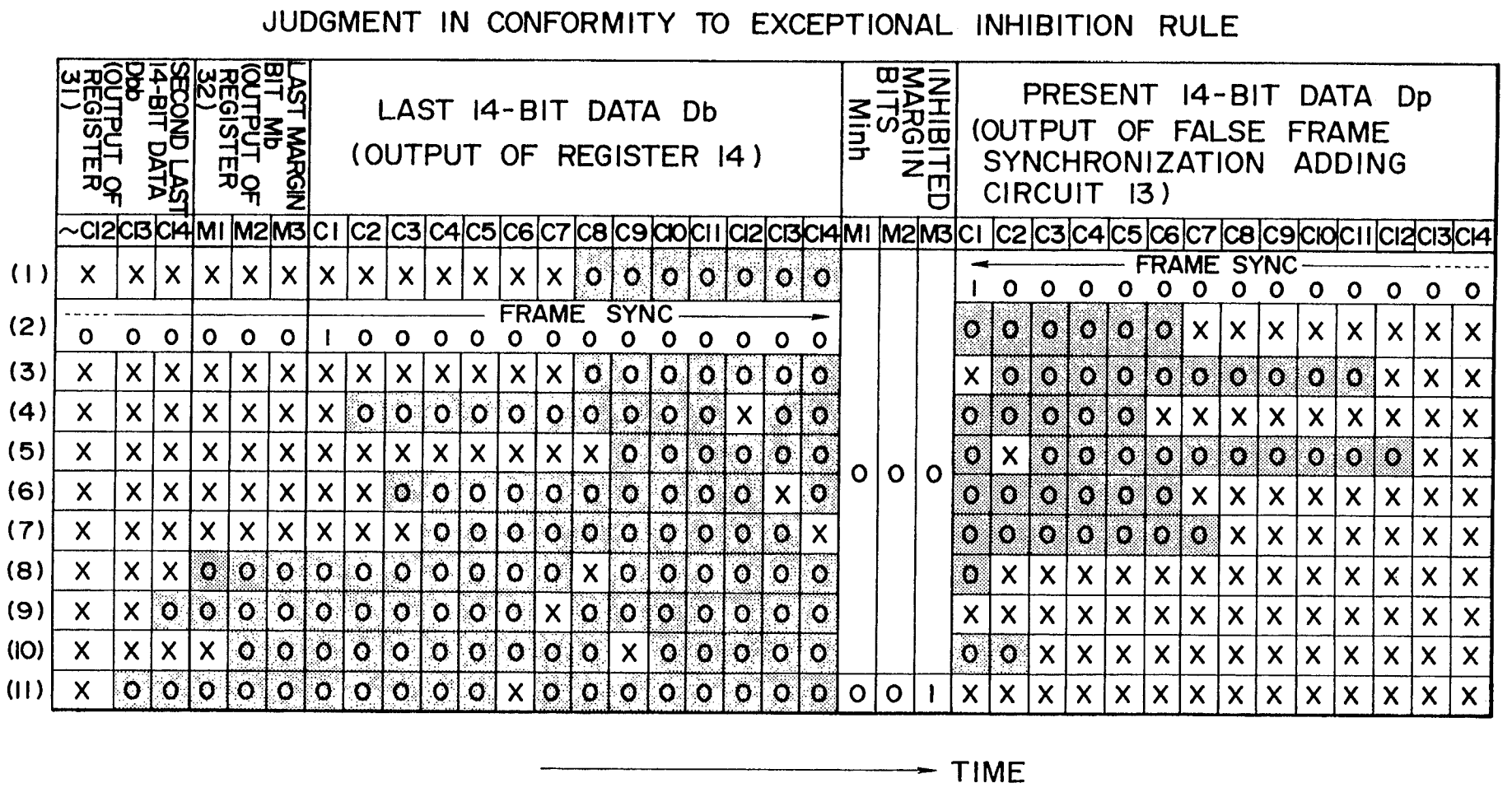

FIGS. 6A and 6B illustrate in diagrammatic view algorithms for judgment of inhibited margin bits employed in the modulator circuit shown in FIG. 4. Referring to FIGS. 6A and 6B, the inhibited margin bit judging circuit 20 performs a test of those bits of input signals Dp, Db, Mb and Dbb thereto which are indicated by shadows in FIGS. 6A and 6B, and judges, in accordance with a result of the test, margin bits Minh which must not be heed for connection between the last 14-bit data Db and the present 14-bit data Dp. Then, the inhibited margin bit judging circuit 20 supplies an inhibition signal Sinh of 4 bits to the margin bit generating circuit 40.

Referring to FIG. 6A, the judging algorithm of the inhibited margin bits Minh according to the EFM 3T to 11T rule is such as described below:

(1) When a total of the quantity A of "0" at the front end of the present 14-bit data Dp and the quantity B of "0" at the rear end of the last 14-bit data Db is equal to or greater than 8 (A+B≧8): the margin bits "000" are inhibited (Minh="000").

2) When the uppermost bit C1 of the present 14-bit data Dp is "1" (A=0) or the second uppermost bit C2 is "1" (A=1) or when the quantity B of "0" at the rear end of the last 14-bit data Db is 9 (B=9): the margin bits "001" are inhibited (Minh="001").

3) When the uppermost bit C1 of the present 14-bit data Dp is "1" (A=0) or the lowermost bit C14 of the last 14-bit data Db is "1" (B=0): the margin bits "010" are inhibited (Minh="010").

4) When the quantity of "0" at the rear end of the present 14-bit data Dp is 9 (A=9) or the lowermost bit C14 of the last 14-bit data Db is "1" (B=0) or else the second last bit C13 is "1" (B=1): the margin bits "100" are inhibited (Minh=100").

Referring now to FIG. 6B, judgments of margin bits which do not violate the EFM 3T to 11T rule but are inhibited in order to prevent a possible occurrence of a frame synchronizing signal in error, that is, judgments of inhibited margin bits according to the exceptional inhibition rule, are such as described below:

Case (1): when the quantity B of "0" at the rear end of the last 14-bit data Db is 7 and a frame synchronizing signal is produced at the timing of the present data.

Case (2): when a frame synchronizing signal is produced at the last data and the first six bits C1 to C6 of the present 14-bit data are equal to 0 (A=6).

Case (3): when B=7 and the upper 11 bits of the present 14-bit data Dp are "10000000000".
Case (4): when the lower 13 bits of the last 14-bit data Db are "0000000000100" and A=5.
Case (5): when B=6 and the upper 12 bits of the present 14-bit data Dp are "010000000000".
Case (6): when the lower 12 bits of the last 14-bit data Db are "000000000010" and A=6.
Case (7): when the lower 11 bits are "00000000001" and A=7.
Case (8): when the last margin bits Mb="000" and the last 14-bit data are "00000001000000" and besides A=1.
Case (9): when the lowermost bit C14 of the second last 14-bit data Dbb is "0" and Mb="000" and besides the last 14-bit data are "00000010000000".
Case (10): when Mb="x00" and the last 14-bit data are "00000000100000" and besides A=2.

In the cases (1) to (10) above, the margin bits "000" are inhibited (Minh="000").

Case (11): when the two lowermost bits of the second last 14-bit data Dbb are "00" and Mb="000" and besides the last 14-bit data are "00000100000000", the margin bits "001" are inhibited (Minh="001").

FIG. 7 shows in block diagram details of an exemplary form of the inhibited margin bit judging circuit 20 constructed in accordance with the judging algorithms described above from a logic circuit such as, for example, a programmable logic array (PLA).

The inhibited margin bit judging circuit 20 includes a decoder 21 which decodes, based on the upper 9 bits C1 to C9 of the present 14-bit data Dp inputted thereto and the lower 9 bits C6 to C14 of the last 14-bit data Db, the quantity A of "0" at the front end of the former (Dp) and the quantity B of "0" at the rear end of the latter (Db) into up to seven cases including A=9, A=1, A=0, B=9, B=1, B=0 and A+B≧0.

Another decoder 22 detects, based on the upper 12 bits C1 to C12 of the present 14-bit data Dp inputted thereto, the last 14-bit data Db, the last margin bits Mb and the lower 2 bits C13 and C14 of the second last 14-bit data Dbb, the 11 cases (1) to (11) described hereinabove.

In the cases of A=9, B=1 and B=0 in which the margin bits "100" are inhibited, an inhibition output of the decoder 21 is supplied to an input A of a latch 27 by way of an OR gate 23. In the cases of A=0 and B=0 in which the margin bits "010" are inhibited, the inhibition output of the decoder 21 is supplied to another input B of the latch 27 by way of another OR gate 24. In the case of A=0, A=1 and B=9 in which the margin bits "001" are inhibited and in the case (11), the inhibition outputs of the decoders 21 and 22 are supplied to a further input C of the latch 27 by way of a further OR gate 25. Further, in the case of A+B≧8 in which the margin bits "000" are inhibited and in the cases (1) to (10), the inhibition outputs of the decoders 21 and 22 are supplied to a still further input D of the latch 27 by way of a still further OR gate 26.

The latch 27 outputs an inhibition signal Sinh to the margin bit generating circuit 40 in accordance with the inputs A to D received from the OR gates 23 to 26, respectively. For example, when the case (7) of the exceptional inhibition rule (the lower 11 bits of the last 14-bit data Db are "00000000001" and A=7) stands, the decoder 21 outputs "B=0" while the decoder 22 outputs the "case (7)", and consequently, the inputs A, B and D of the latch 27 are "1" while the input C is "0".

Accordingly, the inhibition signal Sinh of 4 bits is "1101". The inhibition signal Sinh indicates that, of the four margin bit patterns, the margin bits "100", "010" and "000" are inhibited.

Referring back to FIG. 4, the frame synchronization converting circuit 15 first converts, in response to a frame synchronization timing signal not shown, a false frame synchronizing signal S'f from among 14-bit data successively inputted thereto into the regular frame synchronizing signal Sf of 24 bits and supplies it to a parallel-in/serial-out register 16 without converting the other 14-bit data. The 24-bit parallel-in/serial-out (P/S) register 16 outputs 14-bit data (24-bit data only in the case of the frame synchronizing signal Sf) and 3-bit data (margin bits) alternately and serially in response to channel bit clocks of 4.3218 MHz.

The serial signal outputted at the rate of 4.3218 Mbps is first NRZI modulated by a NRZI circuit 17 and then supplied as an EFM signal to a recording head or a laser diode (not shown either) by way of, for example, a rotary transformer or a recording amplifier so that it is digitally recorded onto a compact disk. The EFM signal is supplied also to a DSV integrating circuit 60, which thus integrates a DC component of the EFM signal in the unit of 17-channel bits and outputs a controlling signal of 3 bits to the margin bit generating circuit 40 in accordance with the cumulative DSV obtained by the integration. For example, when the cumulative DSV has the positive polarity, the data "001" for commanding a decrease "−" of the cumulative DSV are outputted as a controlling signal; when the cumulative DSV is equal to 0, the data "010" for commanding the balance "0" of the cumulative DSV are outputted; and when the cumulative DSV has the negative polarity, the data "100" for commanding an increase "+" of the cumulative DSV are outputted.

The margin bit generating circuit 40 is constructed from a PLA (programmable logic array) which is programmed in advance so as to generate optimum margin bits decisively for each of all possible combinations of input signals. The input signals include, in addition to an inhibition signal of 4-bits inputted from the inhibited margin bit judging circuit 20 described above and a controlling signal of 3 bits inputted from the DSV integrating circuit 60 described above, a CWLL signal of 1 bit representative of a NRZI signal level at the rear end of 14-bit data Db placed forwardly of margin bits and twos complement data of 5 bits representative of a DSV of the 14-bit data succeeding to the margin bits. The margin bit generating circuit 40 is constructed so that it may output, based on a preset priority order of the margin bit patterns, the controlling signal of 3 bits indicative of a desirable controlling direction of the cumulative DSV and the CWLL signal of 1 bit, margin bits of a margin bit pattern of the highest priority order from among the margin bit patterns other than an inhibited margin bit pattern or patterns indicated by the inhibition signal corresponding to the five cases of a 14NWD. Here, the five cases of the 14NWD include a first case wherein the 14NWD is equal to or higher than 3, a second case wherein the 14NWD is equal to 2, a third case wherein the 14NWD is equal to 1, a fourth case wherein the 14NWD is equal to 0, and a fifth case therein the 14NWD is equal to or lower than −1.

Margin bits produced by the margin bit generating circuit 40 (in short, margin bits which are used to connect two groups of 14-bit data Db and Dp) are outputted to the P/S register 16 and also stored as present margin bits Mp into the register 32. The margin bits Mp are later referred to as last margin bits Mb for next 14-bit data for the judgment of the exceptional inhibition rule.

As described above, the judging circuit 30 of the modulator circuit according to the present invention includes the false frame synchronization adding circuit 12 and the inhibited margin bit judging circuit 20 each constituted, for example, from a PLA and is constituted in a small scale logic circuit.

Figure 8:
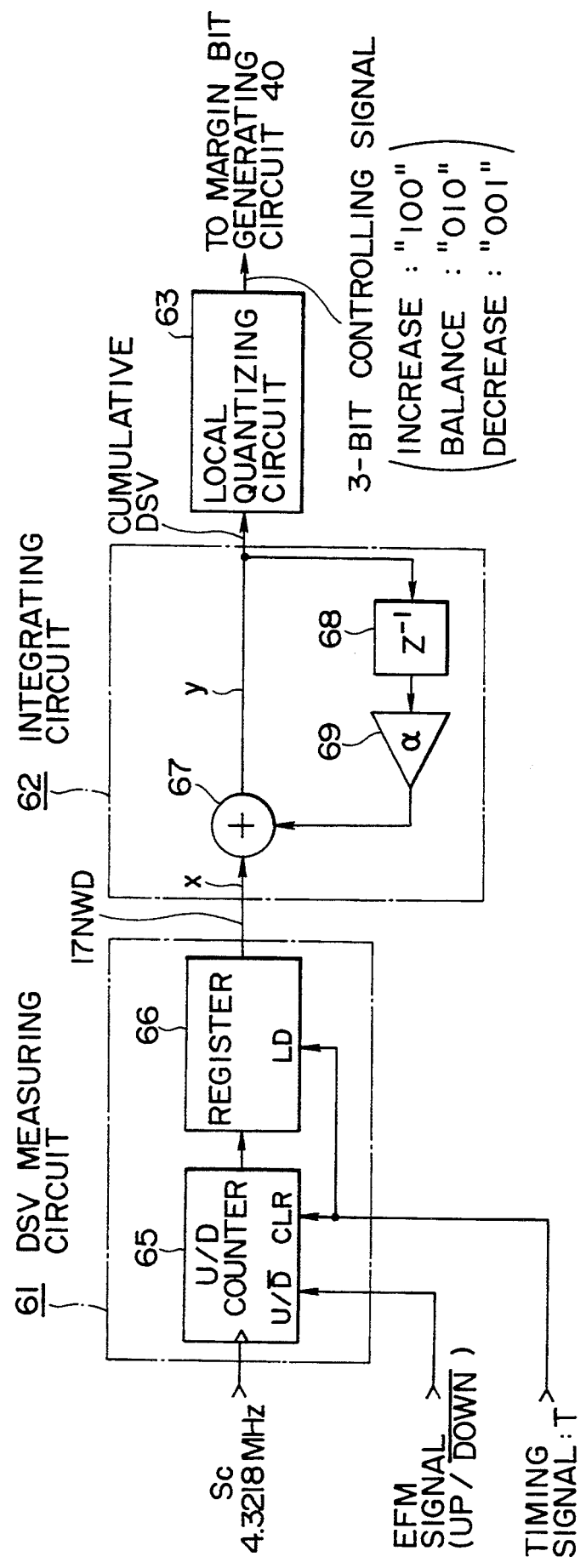
FIG. 8 is a block diagram showing details of a DSV integrating circuit Of the modulator circuit shown in FIG. 4.

Referring now to FIG. 8, there are shown in block diagram details of an exemplary form of the DSV integrating circuit 60 employed in the modulator circuit described above.

Again, the frame synchronization converting circuit 15 shown in FIG. 4 converts, in response to a frame synchronization timing signal not shown, the false frame synchronizing signal S'f of each of 14-bit data successively inputted thereto into a regular frame synchronizing signal Sf of 24 bits and supplies them to the parallel-in/serial-out register 16 without converting the other 14-bit data. The 24-bit parallel-in/serial-out (P/S) register 16 outputs 14-bit data (24-bit data only in the case of the frame synchronizing signal Sf) and 3-bit data (margin bits) alternately and serially in response to channel bit clocks of 4.3218 MHz.

The serial signal outputted at the rate of 4.3218 Mbps is first NRZI modulated by the NRZI circuit 17 and then supplied as an EFM signal to a recording head or a laser diode (not shown either) by way of, for example, a rotary transformer or a recording amplifier so that it is digitally recorded onto a compact disk.

The DSV integrating circuit 60 calculates a cumulative DSV from an EFM signal inputted thereto and outputs a controlling signal of 3 bits indicative of a desired controlling direction (increase, balance or decrease) of the cumulative DSV to the margin bit generating circuit 40 in accordance with the cumulative DSV obtained by the calculation.

The margin bit generating circuit 40 is constructed from a PLA (programmable logic array) which is programmed in advance so as to generate optimum margin bits decisively for each of all possible combinations of input signals. The input signals include, in addition to an inhibition signal of 4-bits inputted from the inhibited margin bit judging circuit 20 described above and a controlling signal of 3 bits inputted from the DSV integrating circuit 60 described above, a CWLL signal of 1 bit representative of an NRZI signal level at the last end of 14-bit data Db placed forwardly of margin bits and twos complement data of 5 bits representative of a DSV of the 14-bit data succeeding to the margin bits. The margin bit generating circuit 40 is constructed so that it may output, based on a preset preferential order of the margin bits, the controlling signal of 3 bits indicative of a desirable controlling direction of the cumulative DSV and the CWLL signal of 1 bit, margin bits of a highest preferential order from among margin bits other than inhibited margin bits indicated by the inhibition signal corresponding to the five cases of 14NWD. Here, the five cases of 14NWD include a first case wherein 14NWD is equal to or higher than 3, a second case wherein 14NWD is equal to 2, a third case wherein 14NWD is equal to 1, a fourth case wherein 14NWD is equal to 0, and a fifth case therein 14NWD is equal to or lower than −1.

Referring to FIG. 8, the DSV integrating circuit 60 receives system clocks Sc of 4.3218 MHz, an EFM signal from the NRZI circuit 17 and a timing signal T indicative of the rear end of each information bit group (14-channel bits, but in the case of a frame synchronizing signal, 24 channel bits; such note is omitted in the following description) in the EFM signal.

An up/down (U/D) counter 65 up counts the system clocks Sc when the EFM signal is at the high level, but on the contrary when the EFM signal is at the low level, the up/down counter 65 down counts the system clocks Sc. Further, since the up/down counter 65 is reset by the timing signal T at the rear end of each information bit group, the count value outputted from the up/down counter 65 represents a DSV (digital sum variation) of a 17-channel bit pattern composed of a margin bit pattern of 3 bits and a 14-channel bit pattern succeeding to the 3-bit margin bit pattern as a unit, in short, a 17NWD. The thus counted 17NWD is stored into a register 66 in response to the timing signal T used as a loading signal, and the up/down counter 65 is reset by the timing signal T so that it makes preparations for next counting of a 17NWD. Here, each 17NWD is a 5-bit data represented, for example, in the form of a twos complement. Further, the up/down counter 65 and the register 66 cooperatively constitute a DSV measuring circuit 61 for measuring a DSV (17NWD) for each unit of a 17-channel bit pattern in an EFM signal.

Each 17NWD outputted from the DSV measuring circuit 61 is integrated by the integrating circuit 62, from which it is outputted as a cumulative DSV.

The integrating circuit 62 includes an adder 67, a delay circuit 68 and a coefficient circuit 69.

Figure 9:
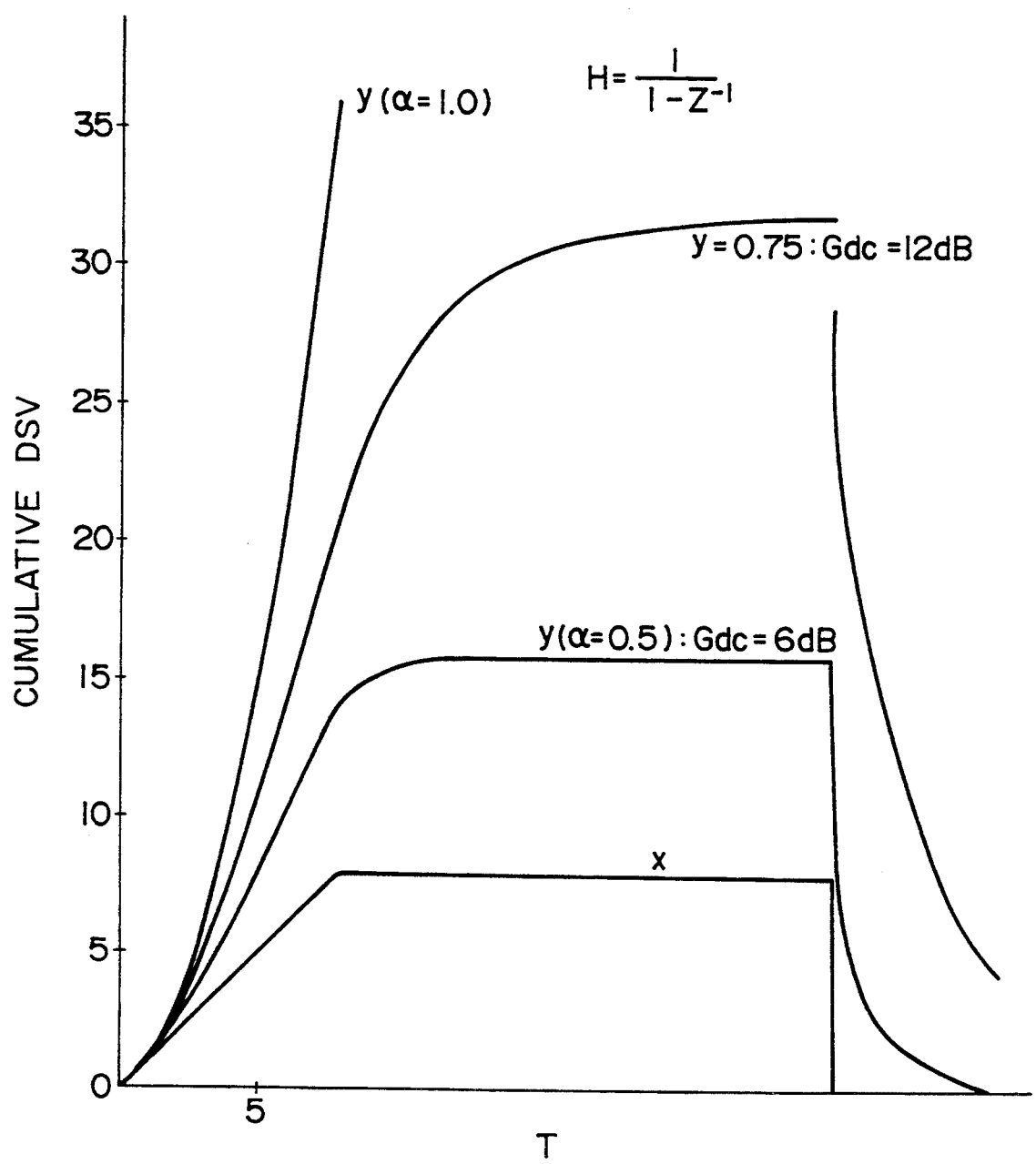
FIG. 9 is a diagram illustrating operation of the DSV integrating circuit shown in FIG. 8.

FIG. 9 illustrates time variations of the output y of the integrating circuit 62 with respect to the input x using a coefficient $\alpha$ set at the coefficient circuit 69 as a parameter. In FIG. 9, the variations are shown when the parameter $\alpha$ is $\alpha = 1.0$, 0.75 and 0.5.

Since the transfer function of the integrating circuit 62 is given by $H = 1/(1 - \alpha Z^{-1})$, when $\alpha = 1.0$, the integrating circuit 62 makes a complete integrating circuit wherein the dc gain Gdc is infinitely great (Gdc = $\infty$). Meanwhile, when $1.0 > \alpha > 0$, the integrating circuit 62 makes a leaky interesting circuit wherein the dc gain Gdc has a finite value (for example, when $\alpha = 0.75$, Gdc = 12 dB, and when $\alpha = 0.5$, Gdc = 6 dB) and accordingly has such a saturation characteristic as seen from FIG. 9. Accordingly, even if the word length is finite (this means that, for example, a cumulative DSV is represented in a binary value of 8 bits), it can be avoided that the cumulative DSV overflows to cause disorder of control described above.

Therefore, the DSV integrating circuit 60 of the modulator circuit according to the present invention is formed from the so-called leaky integrating circuit 62 wherein the coefficient $\alpha$ described above is lower than 1 ($1 > \alpha > 0$). The reason why the leaky integrating circuit 62 is employed is such as described below.

While it is ideal to calculate a cumulative DSV by means of a complete integrating circuit ($\alpha = 1$) and control the cumulative DSV of an EFM signal so that it may always approach zero, it is not always possible, from the restrictions of the EFM 3T to 11T rule and the exceptional inhibition rule, to achieve addition of margin bits of the best margin bit pattern from among the four margin bit patterns with which the cumulative DSV can be caused to approach zero to the utmost. In other words, from the restrictions of the EFM 3T to 11T rule and the exceptional inhibition rule, it cannot be avoided that control of the cumulative DSV in the modulator circuit of the CD system is rough and very far from ideal control.

Thus, according to the present invention, a DSV is integrated by the leaky integrating circuit 62 which conforms to such rough control, thereby making sufficient use of advantages the leaky integrating circuit 62 has. Consequently, the following characteristics are achieved.

(1) Since the integrated value (cumulative DSV) exhibits a saturation characteristic as seen from FIG. 9, an otherwise possible overflow can be eliminated for a finite word length, and even if the control is disordered by some reason, the convergence is fast as seen from an attenuation characteristic shown in FIG. 9 (a decreasing curve of y in FIG. 9 when x is reduced stepwise to zero).

(2) Since the cumulative DSV has a saturation characteristic, a short word length can be used, and the circuit can be simplified and formed in a small scale.

(3) Since a dead zone is provided for outputting of a controlling signal from a local quantizing circuit 63 as hereinafter described, the controlling system for the cumulative DSV is stabilized.

Referring back to FIG. 8, a cumulative DSV outputted from the integrating circuit 62 is inputted as data of a word length conforming to a saturation value thereof to a local quantizing circuit 63.

The local quantizing circuit 63 quantizes the thus inputted cumulative DSV into the following three regions and outputs a result of the quantization as a controlling signal for indicating a desirable controlling direction (increase, balance or decrease) of the cumulative DSV to the margin bit generating circuit 40 (refer to FIG. 4).

First, when the absolute value of the cumulative DSV is within the range of $Bd \geq$ cumulative $DSV \geq -Bd$ with regard to a predetermined value Bd, the cumulative DSV is considered to be substantially equal to zero, and a controlling signal of 3 bits "010" to instruct to avoid a variation of the cumulative DSV to the utmost (to instruct "balance") is provided as a quantization output.

Here, the range of $Bd \geq$ cumulative $DSV \geq -Bd$ mentioned above is a dead zone for enhancing stabilized control of the cumulative DSV.

Second, when the cumulative DSV is higher than the predetermined value Bd (cumulative DSV>Bd), since it is desirable to decrease the cumulative DSV to approach zero at a next 17NWD, a controlling signal "001" to instruct a "decrease" of the cumulative DSV is provided as a quantization output.

Third, when the cumulative DSV is in the negative and the absolute value thereof is higher than the predetermined value Bd (cumulative DSV<−Bd), since it is desirable to increase the cumulative DSV to approach zero at a next 17NWD, a controlling signal "100" to instruct an "increase" of the cumulative DSV is provided as a quantization output.

The 3-bit controlling signal "001", "010" or "100" outputted in this manner is supplied to the margin bit generating circuit 40 described hereinabove for the decisive generation of optimum margin bits.

It is to be noted that, while the modulator circuit in conformity to the CD system is described above, the technical scope of the present invention can apparently be applied to general modulator circuits wherein each input m-bit code is modulated into an n-channel (n>m) bit pattern and each two such n-channel bit patterns are coupled to each other using one of a plurality of margin bit patterns to limit the longest and shortest recording wavelengths while suppressing low band components of a recording waveform.

Figure 10:
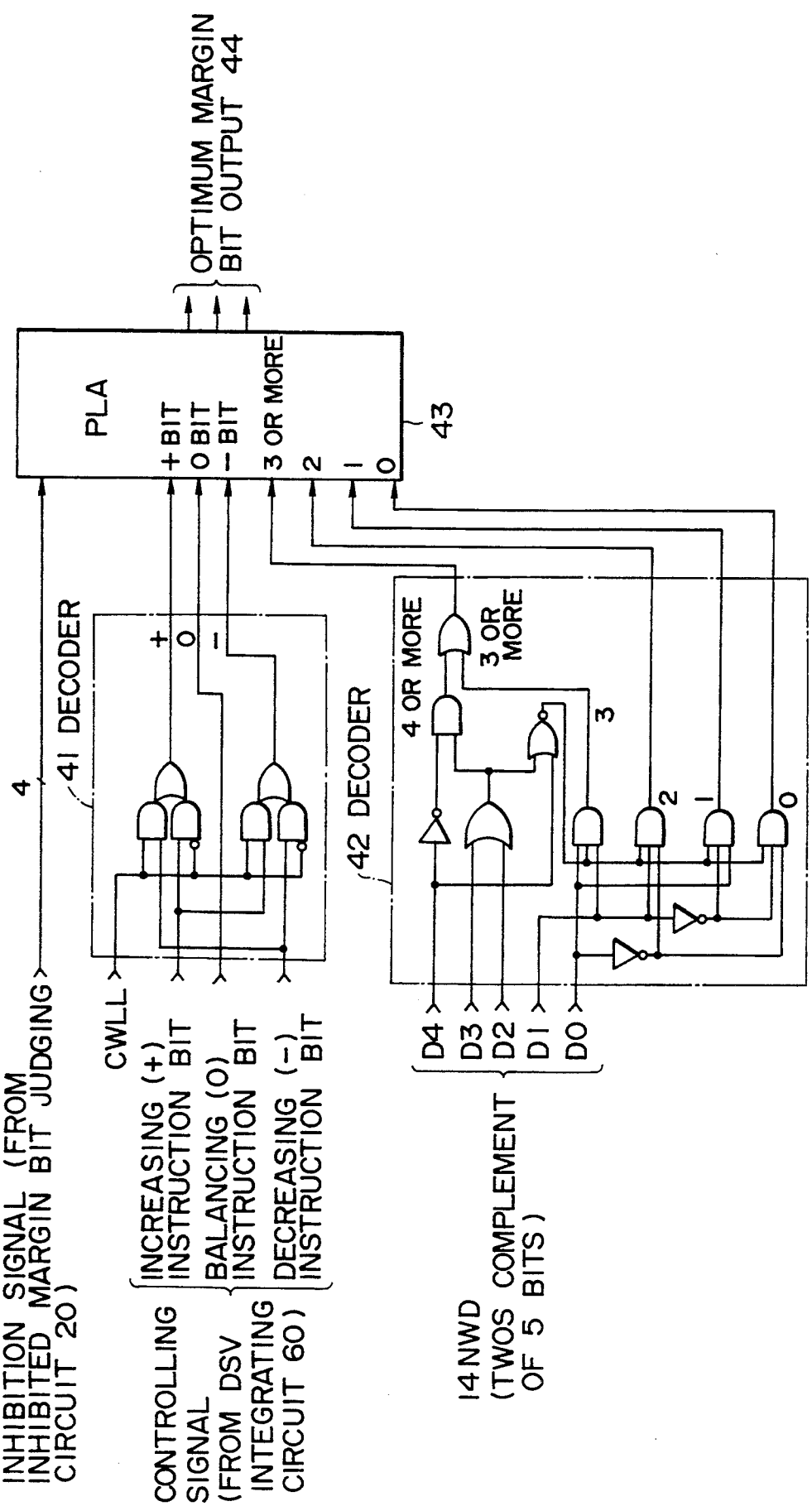
FIG. 10 is a block diagram showing details of a margin bit generating circuit of the modulator circuit shown in FIG. 4.

Referring now to FIG. 10, there are shown in block diagram details of an exemplary form of the margin bit generating circuit 40. The margin bit generating circuit 40 decisively generates optimum margin bits from within the four margin bit patterns "100", "010", "001" and "000" in accordance with situations then. The optimum margin bits are selected so that, when two 14-bit data Db and Dp are connected using the margin bits, the EFM 3T to 11T rule is met also at the connecting portion and occurrence of a frame synchronizing signal in error is prevented and besides a cumulative DSV of an EFM signal is caused to approach zero to the utmost.

The margin bit generating circuit 40 of the modulating circuit (FIG. 4) of the present invention is constructed such that it outputs optimum margin bits decisively in accordance with situations of two bit patterns of 14-bit data, the cumulative DSV and so forth as different from a conventional margin bit generating circuit wherein the four margin bit patterns are tested individually and optimum margin bits are determined from the result of the tests and outputted. The margin bit generating circuit 40 receives such input signals as described below.

First, an inhibition signal of 4 bits is inputted from the inhibited margin bit generating circuit 20. When a particular margin bit pattern of patterns cannot be inserted between two 14-bit data Db and Dp because they violate the EFM 3T to 11T rule or they will result in generation of a frame synchronizing signal in error, one of ones of the 4 bits of the inhibition signal corresponding to the margin bit pattern or patterns are changed to "1" to indicate inhibition of use of the margin bit pattern of pattern. For example, when the first and third margin bit patterns from among the four margin bit patterns "100", "010", "001" and "000" are inhibited from use, the 4-bit inhibition signal is "1010".

Second, a controlling signal of 3 bits is inputted corresponding to a cumulative DSV from the DSV integrating circuit 60. The 3-bit controlling signal indicates that the desirable controlling direction of the cumulative DSV is, in the descending order from the uppermost bit, an increase "+", a balance "0" and a decrease "−". Accordingly, when the cumulative DSV is DSV>0, the controlling signal is set to "001" so as to command a decrease of the cumulative DSV; when the cumulative DSV is DSV<0, the controlling signal is set to "100" so as to command an increase of the cumulative DSV: and when the cumulative DSV is DSV=0, the controlling signal is set to "010" so as to command so that the cumulative DSV may not be increased nor decreased to the utmost.

A 14NWD signal of 5 bits and a CWLL signal of 1 bit are inputted as third and fourth input signals, respectively.

Figure 11:
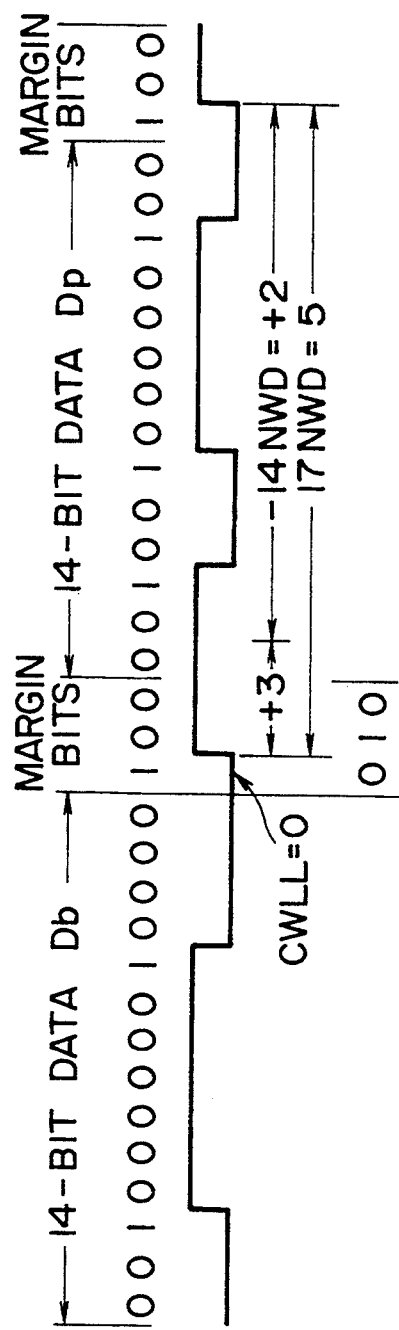
FIG. 11 is a diagram illustrating operation of the margin bit generating circuit of FIG. 10 when two 14-bit data are connected with margin bits.

FIG. 11 shows exemplary NRZI waveforms of two 14-bit data Db and Dp coupled to each other using margin bits. A variation of the cumulative DSV when margin bits are added to the last 14-bit data Db, in short, a DC component of the margin bits (hereinafter referred to as DSV of margin bits), is represented with reference to that of the case wherein the signal level of the NRZI waveform upon starting of the margin bit pattern (such signal level will be hereinafter referred to as CWLL) is at the low level (="0"). In particular, as seen from curves (A) to (D) in FIG. 11, the DSV of the first margin bit pattern "100" is +3; the DSV of the second margin bit pattern "010" is +1; the DSV of the third margin bit pattern "001" is −1; and the DSV of the fourth margin bit pattern "000" is −3. When the CWLL is equal to "1" (at the high level), the values of the DSVs of the margin bits individually have the opposite signs.

Similarly, a variation of the cumulative DSV when 14-bit data Dp are added to margin bits, in short, a DC component of the 14-bit data Dp (hereinafter referred to as 14NWD), is represented with reference to that of the case wherein the signal level of the NRZI waveform upon starting of the 14-bit data Dp is at the low level. In particular, the 14NWD of the 14-bit data Dp shown in FIG. 11 (="00100100000100") is −2.

A variation of the cumulative DSV when the next 14-bit data Dp are connected to the 14-bit data Db using a margin bit pattern of 3 bits (such variation will be hereinafter referred to as 17NWD) is a difference of the 14NWD from the DSV of margin bits of a margin bit pattern when the margin bit pattern is the first, second of third margin bit pattern, but is a sum of the 14NWD to the DSV of margin bits of a margin bit pattern when the margin bit pattern is the fourth margin bit pattern "000".

Figure 12:
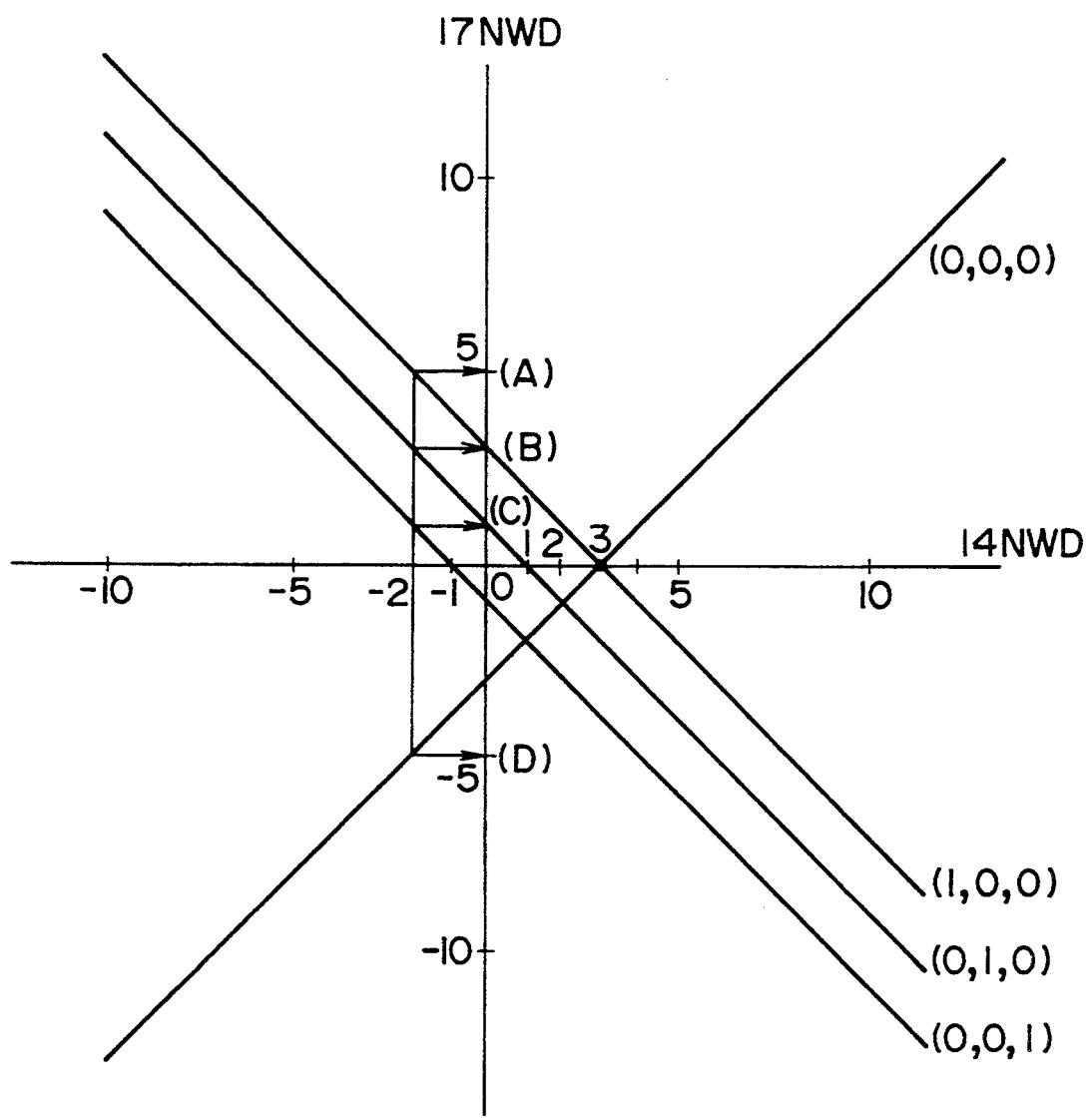
FIG. 12 is a nomograph illustrating determination of a 17NWD from a 14NWD when a CWLL is equal to "0"
Figure 13:
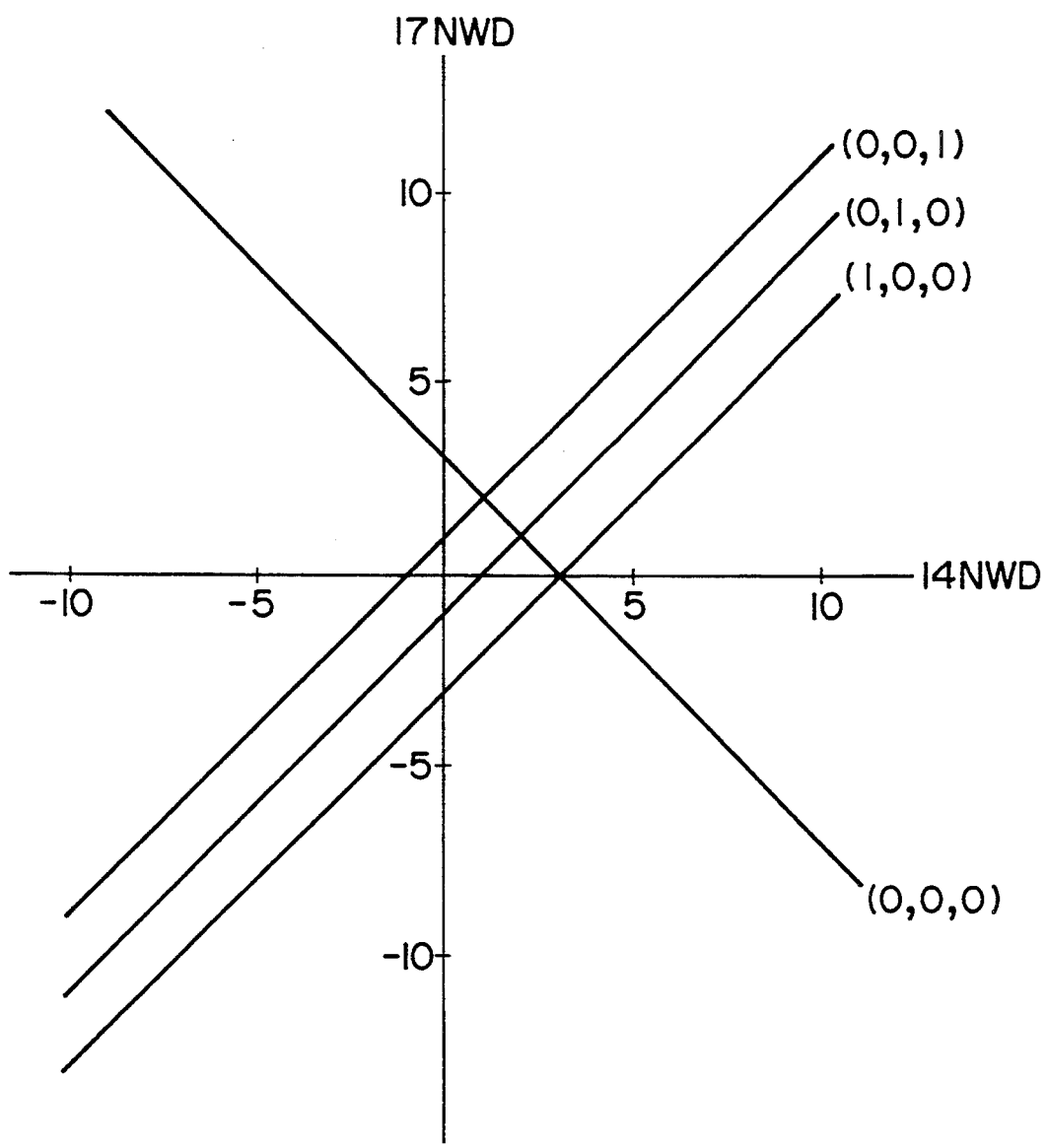
FIG. 13 is a similar view but illustrating determination of a 17NWD from a 14NWD when the CWLL is equal to "1"

FIG. 12 shows a monogram for finding out a 17NWD from a 14NWD when the CWLL is equal to "0" (at the low level), and FIG. 13 shows another monogram for finding out a 17NWD from a 14NWD when the CWLL is equal to "1" (at the high level).

The points (A), (B), (C) and (D) in FIG. 12 indicate 17NWDs corresponding to the four kinds of margin bit patterns "100", "010", "001" and "000" to be inserted, respectively, when the 14NWD of the 14-bit data Dp is equal to 14NWD=−2.

A case wherein the 14NWD of the next 14-bit data Dp is equal to or higher than 3 when the CWLL is equal to 0 as shown in FIG. 12 is examined here.

First, if the cumulative DSV till now is equal to 0 or in the negative, then the next 17NWD is desired to be set to zero of the positive so as to increase the cumulative DSV in order to cause the cumulative DSV to approach zero. Only the margin bit pattern "000" allows 17NWD≧0 in the case of 14NWD≧3, and accordingly, the first priority is given to the margin bits "000". In case the margin bits "000" of the first priority cannot be inserted due to the EFM 3T to 11T rule or the exceptional inhibition rule, if the second priority is given to the second best margin bits "100"; the third priority is given to the margin bits "010"; and the fourth priority is given to the margin bits "001", then optimum margin bit, in the case of 14NWD≧3 when CWLL=0 can be determined decisively. In other words, it is not necessary to individually test the four margin bit patterns as in a conventional margin bit generating circuit.

Similarly, if 14NWD≧3 and the cumulative DSV till now is in the positive, then the next 17NWD is desired to be set to the negative so as to decrease the cumulative DSV. In this instance, if the priority order of the margin bits is determined as "010", "001", "100" and "000", then optimum margin bits can be determined decisively.

Similarly, the priority order of the four margin bit patterns is logically determined for each of the cases of 14NWD=2, 14NWD=1, 14NWD=0 and 14NWD≦−1.

With regard to the case wherein the CWLL is equal to "1" (at the high level) shown in FIG. 13, the priority order of the margin bits is determined similarly for each of the five cases wherein the 14NWD of the next 14-bit data Dp is equal to or higher than +3, equal to +2, +1, 0 and equal to or lower than −1. However, as apparent from comparison between FIG. 12 which shows the homogram in the case of CWLL="0" and FIG. 13 which shows the homogram in the case of CWLL="1", the two graphs are symmetrical with each other with respect to the x-axis (axis representative of the 14NWD), and accordingly, if the signs of the y-axis (axis representative of the 17NWD) of FIG. 6 are reversed, then the graph of FIG. 13 will be identical with the graph of FIG. 12. In particular, when the CWLL is equal to "1", if the controlling signal of 3 bits is changed in such a manner that "100" (=command to increase the cumulative DSV) is changed to "001" (=decreasing command) and "001" is changed to "100", then the optimum margin bit determining algorithm for the case of CWLL="0" can be applied as it is to the case of CWLL="1".

Referring back to FIG. 10, the margin bit generating circuit 40 includes a decoder 41 for converting a controlling signal of 3 bits using a CWLL signal as a gate signal so that the margin bit determining algorithm for the case of CWLL="0" may be applied commonly to the case of CWLL="1". The truth table for the decoder 41 is shown in FIG. 14A.

The margin bit generating circuit 40 further includes another decoder 42 for converting a 14NWD represented in the form of twos complement of 5 bits into a 4-bit signal indicating any of the five cases described hereinabove. The truth table for the decoder 42 is shown in FIG. 14B.

The margin bit generating circuit 40 further includes a PLA 43 (programmable logic array) which receives as inputs thereto an inhibition signal of 4 bits supplied from the inhibited margin bit judging circuit 20, a controlling signal of 3 bits supplied from the decoder 41 and a 4-bit signal supplied from the decoder 42 and is programmed in advance so as to output optimum margin bits 44. Truth tables programmed in the PLA 43 are shown in FIGS. 15A to 15D, wherein FIGS. 15A and 15B show truth tables of 52 terms when CWLL="0" while FIGS. 15C and 15D show truth tables of 52 terms when CWLL="1".

Since the same truth tables can be used commonly for the case of CWLL="0" and for the case of CWLL="1" by conversion using the decoder 41, the truth tables of 52 terms are actually programmed in the PLA 43.

In FIGS. 15A to 15D, the value "1" represents "truth" (flag) while the value "0" represents "false". Meanwhile, "x" allows either of the truth and the false. The four rows (terms) indicated, for example, at the uppermost stages in FIG. 15A signify the following.

In case CWLL=0 and the controlling signal is "xx0" (this is at least not a decreasing instruction), if the 14NWD is in the case of 14NWD≧0, the priority order of the margin bits is, in the descending order, "000", "100", "010" and "001". In particular, if the margin bits "000" of the first priority are not inhibited (inhibition signal="xxx0"), they are outputted as optimum margin bits. If the margin bits "000" of the first priority are inhibited but the margin bits "100" of the second priority are not inhibited (inhibition signal="xx01"), then the margin bits "100" are outputted as optimum margin bits in this instance. If the margin bits of both of the first and second priorities are inhibited but the margin bits of the third priority are not inhibited (inhibition signal="x011", the margin bits "010" of the third priority are outputted as optimum margin bits in this instance. When all of the margin bits of the first to third priorities are inhibited (inhibition signal=0111"), the margin bits "001" of the fourth priority are outputted.

In this manner, optimum margin bits 44 determined logically by the PLA 43 without actually testing the individual margin bits are outputted.

It is to be noted that, while the modulator circuit in conformity to the CD system is described above, the technical scope of the present invention can apparently be applied to general modulator circuits wherein each input m-bit code is modulated into an n-channel (n>m) bit pattern and each two such n-channel bit patterns are coupled to each other using one of a plurality of margin bit patterns to limit the longest and shortest recording wavelengths while suppressing low band components of a recording waveform.

Having now fully described the invention, it will be apparent to one of ordinary skill in the art that many changes and modifications can be made thereto without departing from the spirit and scope of the invention as set forth herein.

What is claimed is:

1. A modulator circuit wherein each input m-bit code is modulated into an n-channel bit pattern, n being greater than m, and two adjacent ones of such n-channel bit patterns are coupled to each other using one of a plurality of margin bit patterns to limit the longest and shortest recording wavelengths while suppressing low band components of a recording waveform, comprising:

a first logic circuit for adding an n-bit false frame synchronizing signal having a bit pattern at least part of which is the same as part of a frame synchronizing signal in order to achieve unified judgment of an inhibited margin bit patterns out of said plurality of margin bit patterns; and a second logic circuit for referring to the second last, the last and present n-channel bit patterns and the last margin bit pattern to judge an inhibited margin bit patterns in accordance with a predetermined algorithm and outputting an inhibition signal representative of the thus judged margin bit pattern out of said plurality of margin bit patterns.

2. A modulator circuit according to claim 1, further comprising:

a digital sum variation measuring circuit for receiving an output signal of said modulator circuit and measuring a digital sum variation of each margin bit pattern and an n-channel bit pattern following the margin bit pattern; and an integrating circuit for receiving an output signal of said digital sum variation measuring circuit, integrating the digital sum variation with a finite dc gain to obtain a controlling signal regarding a cumulative digital sum variation and outputting the controlling signal to a margin bit generating circuit.

3. A modulator circuit according to claim 1, further comprising:

margin bit generating means for receiving a signal regarding an inhibited margin bit patterns, a controlling signal regarding a last recording waveform level of an n-channel bit pattern placed prior to the margin bit pattern, another controlling signal regarding a cumulative digital sum variation and another controlling signal regarding another cumulative digital sum variation of another n-channel bit pattern placed subsequent to the margin bit pattern and outputting an optimum margin bit pattern from among said margin bit patterns decisively with a logic circuit.

4. A modulator circuit wherein each input m-bit code is modulated into an n-channel bit pattern, n being greater than m, and two adjacent ones of such n-channel bit patterns are coupled to each other using one of a plurality of margin bit patterns to limit the longest and shortest recording wavelengths while suppressing low band components of a recording waveform, comprising:

a first logic circuit for adding an n-bit false frame synchronizing signal having a bit pattern at least part of which is the same as part of a frame synchronizing signal in order to achieve unified judgment of at least one inhibited margin bit pattern out of said plurality of margin bit patterns;

a second logic circuit for referring to the second last, the last and present n-channel bit patterns and the last margin bit pattern to judge at least one inhibited margin bit pattern in accordance with a predetermined algorithm and outputting an inhibition signal representative of the thus judged margin bit pattern out of said plurality of margin bit patterns;

a digital sum variation measuring circuit for receiving an the inhibition signal, measuring a digital sum variation of each margin bit pattern and an n-channel bit pattern following the margin bit pattern and generating an output signal;

an integrating circuit for receiving the output signal of said digital sum variation measuring circuit, integrating the digital sum variation with a finite dc gain to generate a controlling signal regarding a cumulative digital sum variation; and margin bit generating means for receiving the controlling signal regarding a cumulative digital sum variation, a controlling signal regarding a last recording waveform level of an n-channel bit pattern placed prior to the margin bit pattern, and a controlling signal regarding another cumulative digital sum variation of another n-channel bit pattern placed subsequent to the margin bit pattern and outputting from a logic circuit an optimum margin bit pattern from among said margin bit patterns.

* * * * *